(12) United States Patent
Tao et al.

(10) Patent No.: US 8,609,484 B2
(45) Date of Patent: Dec. 17, 2013

(54) METHOD FOR FORMING HIGH-K METAL GATE DEVICE

(75) Inventors: Lee-Wee Tao, Singapore (SG); Han-Guan Chew, Singapore (SG); Harry Hak-Lay Chuang, Hsin-Chu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 438 days.

(21) Appl. No.: 12/617,004

(22) Filed: Nov. 12, 2009

(65) Prior Publication Data

US 2011/0108928 A1 May 12, 2011

(51) Int. Cl.
*H01L 29/00* (2006.01)
(52) U.S. Cl.
USPC .......................... 438/211; 438/257; 438/261

(58) Field of Classification Search
USPC ........... 438/211, 257, 261; 257/324, 329, 591
See application file for complete search history.

(56) References Cited

U.S. PATENT DOCUMENTS

2007/0281425 A1* 12/2007 Wang ............................ 438/261
2008/0237700 A1* 10/2008 Kim et al. ..................... 257/326
2009/0104764 A1* 4/2009 Xia et al. ...................... 438/595

* cited by examiner

*Primary Examiner* — Howard Weiss
*Assistant Examiner* — Steven Rao
(74) *Attorney, Agent, or Firm* — Haynes and Boone, LLP

(57) ABSTRACT

The present disclosure provides a method of fabricating a semiconductor device that includes providing a semiconductor substrate, forming a metal gate on the substrate, the metal gate having a first gate resistance, removing a portion of the metal gate thereby forming a trench; and forming a conductive structure within the trench such that a second gate resistance of the conductive structure and remaining portion of the metal gate is lower than the first gate resistance.

20 Claims, 24 Drawing Sheets

METHOD FOR FORMING HIGH-K METAL GATE DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, it has been observed that multiple metal layers of the metal gate exhibit high gate resistance which can increase RC delay of the circuit and degrade device performance.

SUMMARY

One of the broader forms of an embodiment of the present invention involves a method for fabricating a semiconductor device. The method includes providing a semiconductor substrate; forming a metal gate on the substrate, the metal gate having a first gate resistance; removing a portion of the metal gate thereby forming a trench; and forming a conductive structure within the trench such that a second gate resistance of the conductive structure and remaining portion of the metal gate is lower than the first gate resistance.

Another one of the broader forms of an embodiment of the present invention involves a method for fabricating a semiconductor device. The method providing a semiconductor substrate; forming a metal gate on the substrate in a gate last process, the metal gate having a first gate resistance; and modifying a portion of the metal gate in such a manner that the modified metal gate has a second gate resistance lower than the first resistance.

Yet another one of the broader forms of an embodiment of the present invention involves a semiconductor device. The semiconductor device includes a semiconductor substrate; and a gate structure disposed on the substrate. The gate structure includes a gate dielectric and a gate electrode. The gate electrode includes a lower portion disposed on the gate dielectric and formed of a first metal structure and an upper portion formed of a second metal structure different from the first metal structure, where the gate electrode has a first gate resistance that is lower than a second gate resistance of another gate electrode that would have been formed of the first metal structure and not the second metal structure.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure provides examples of a "gate last" metal gate process, however one skilled in the art may recognize applicability to other processes and/or use of other materials.

Figure 1:
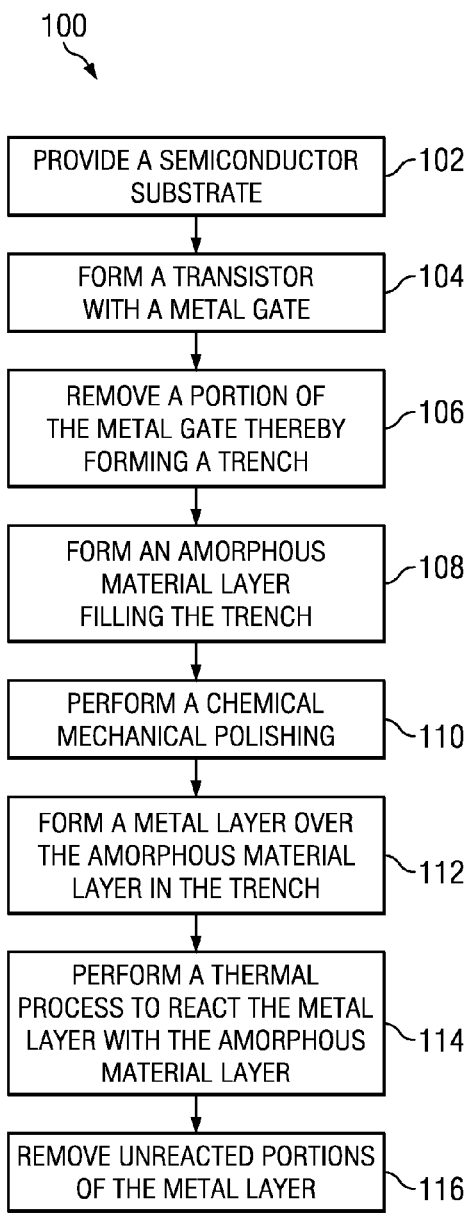
FIG. 1 is a flowchart illustrating a method of fabricating a semiconductor device with a metal gate according to various aspects of the present disclosure.

Referring to FIG. 1, illustrated is a flowchart of a method 100 for fabricating a semiconductor device with a metal gate according to various aspects of the present disclosure. The method 100 begins with block 102 in which a semiconductor substrate is provided. The method 100 continues with block 104 in which a transistor is formed with a metal gate. The method 100 continues with block 106 in which a portion of the metal gate is removed thereby forming a trench. The method 100 continues with block 108 in which an amorphous material layer is formed filling the trench. The method 100 continues with block 110 in which a chemical mechanical polishing (CMP) is performed. The method 100 continues with block 112 in which a metal layer is formed over the amorphous material layer in the trench. The method 100 continues with block 114 in which a thermal process is performed to react the metal layer with the amorphous material layer. The method 100 continues with block 116 in which the unreacted portions of the metal layer are removed. The discussion that follows illustrates an embodiment of a semiconductor device that can be fabricated according to the method 100 of FIG. 1.

Figure 2A:
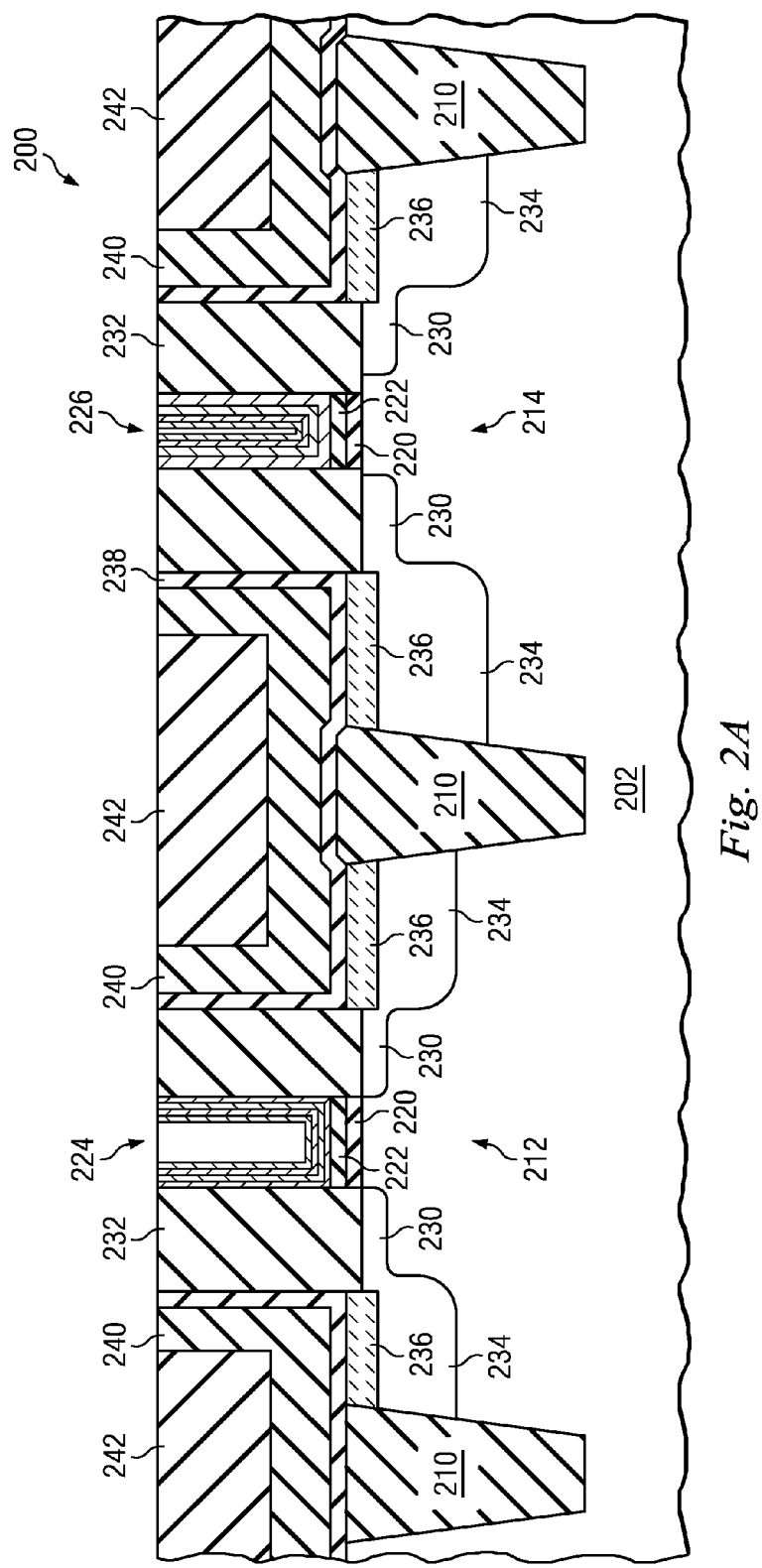
FIGS. 2A-2F are cross-sectional views of an embodiment of a semiconductor device at various stages of fabrication according to the method of FIG. 1.

Referring to FIGS. 2A-2F, illustrated are cross-sectional views of a semiconductor device 200 at various stages of fabrication according to the method 100 of FIG. 1. It is noted that part of the semiconductor device 200 may be fabricated with CMOS technology processing. Accordingly, it is understood that additional processes may be provided before, during, and after the method 100 of FIG. 1, and that some other processes may only be briefly described herein. Further, the semiconductor device 200 may be fabricated in a gate last process (also referred to as a replacement poly gate process). In a gate last process, a dummy gate structure (e.g., dummy poly) is initially formed and may be followed a CMOS technology processing until deposition of an inter-level dielectric (ILD). The dummy gate structure may then be removed and replaced with a metal gate structure. In FIG. 2A, the semiconductor device 200 is shown following formation of various metal layers (e.g., barrier metal, liner metal, work function metal, wetting metal, fill metal, etc.) of an n-type MOSFET (nFET) and p-type MOSFET (pFET). A chemical mechanical polishing (CMP) is performed to planarize the device following deposition of the various metal layers.

The semiconductor device 200 may include a semiconductor substrate 202 such as a silicon substrate. The substrate 202 may alternatively include silicon germanium, gallium arsenic, or other suitable semiconductor materials. The substrate 202 may further include doped regions such as a p-well and n-well. The substrate may further include other features such as a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 200 may further include an isolation structure 210 such as a shallow trench isolation (STI) feature formed in the substrate 202 for isolating active regions 212 and 214 in the substrate. The isolation structure 210 may be formed of silicon oxide, silicon nitride, silicon oxynitride, fluoride-doped silicate (FSG), and/or a low k dielectric material known in the art. The active region 212 may be configured for an nFET and the active region 214 may be configured for a pFET.

The nFET 212 and pFET 214 include a gate dielectric and a gate electrode. The formation of the gate includes forming various material layers, and etching/patterning the various material layers to form a gate stack of the nFET 212 and a gate stack of the pFET 214. The gate dielectric includes an interfacial layer 220 formed over the substrate 202. The interfacial layer 220 includes a silicon oxide layer (e.g., thermal or chemical oxide formation) having a thickness ranging from about 5 to about 10 angstrom (A). The gate dielectric further includes a high-k dielectric layer 222 formed on the interfacial layer 220. The high-k dielectric layer 222 may be formed by atomic layer deposition (ALD) or other suitable technique. The high-k dielectric layer 222 may include a thickness ranging from about 10 to about 30 angstrom (A). The high-k dielectric layer 222 may include hafnium oxide (HfOx). Alternatively, the high-k dielectric layer 222 may optionally include other high-k dielectrics such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), and combinations thereof. Further, the high dielectric layer 222 may also include Sr-based or other high-k materials with k-values higher than hafnium oxide. In some embodiments, a capping layer such as aluminum oxide and lanthanum oxide may be formed as part of the gate stack.

As noted above, the nFET 212 and pFET 214 include gate electrodes 224, 226, respectively, that are formed of various metal layers in a gate last process. The various metal layers include barrier layers, liner layers, n-type or p-type work function metal layers, wetting layers, and fill metal layers. For example, the metal layers include, but are not limited to, Ta, TaN, TiAl, TiN, Ti, Al, W, and WN. The gate electrode 224 is configured to perform an n-type effective work function and the gate electrode 226 is configured to perform a p-type effective work function. The metal layers may be formed by various deposition techniques such as ALD, physical vapor deposition (PVD or sputtering), CVD, or other suitable technique. The thicknesses of the metal layers may vary depending on design requirements.

In a gate last process, a dummy gate structure (e.g., dummy poly) is initially formed and may be followed by CMOS technology processing until deposition of an inter-level dielectric (ILD). A chemical mechanical polishing (CMP) is performed on the ILD to expose the dummy gate structure. The dummy gate structure may then be removed thereby forming a trench. The trench is filled with the various metal layers and N/P metal patterning may be performed to provide the proper metal layers for the respective nFET 212 and pFET 214. Another CMP is performed to planarize the device and remove the various metal layers outside of the trench.

It has been observed that the metal gates of the nFET and pFET exhibit high gate resistance (e.g., 100 ohm/$\mu m^2$) due to the various metal layers (e.g., barrier layers, work function metal layers, liner layers, wetting layers, fill metal layers, etc.) formed in the respective devices. This can increase RC delay of the circuit and degrade device performance. Accordingly, the processing discussed below with reference to FIGS. 2B-2F modifies the gate electrodes 224, 226 to reduce the gate resistance by one order of magnitude and improve subsequent processing of the semiconductor device 200.

It is noted that the semiconductor device 200 may undergo other CMOS technology processing to form various features of the nFET 212 and pFET 214 as is known in the art. As such, the various features are only briefly discussed herein. The various features are formed prior to formation of the gate electrodes 224, 226 in a gate last process. The various features may include lightly doped source/drain regions (n-type and p-type LDD) 230, sidewall or gate spacers 232, source/drain (n-type and p-type S/D) regions 234, silicide features 236, oxide layer 238, contact etch stop layer (CESL) 240, and an inter-level dielectric (ILD or specified as ILD0) 242. The n-type LDD and S/D regions may be doped with P or As, and the p-type LDD and S/D regions may be doped with B or In. The sidewall spacers 232 may be formed of silicon nitride or other suitable materials. The silicide features 236 may be formed by a self-aligned silicidation (salicidation) process. The CESL 240 may be formed of silicon nitride, silicon oxynitride, or other suitable materials. The ILD 242 may include an oxide formed by a high aspect ratio process (HARP) and/or high density plasma (HDP) deposition process.

Figure 2B:
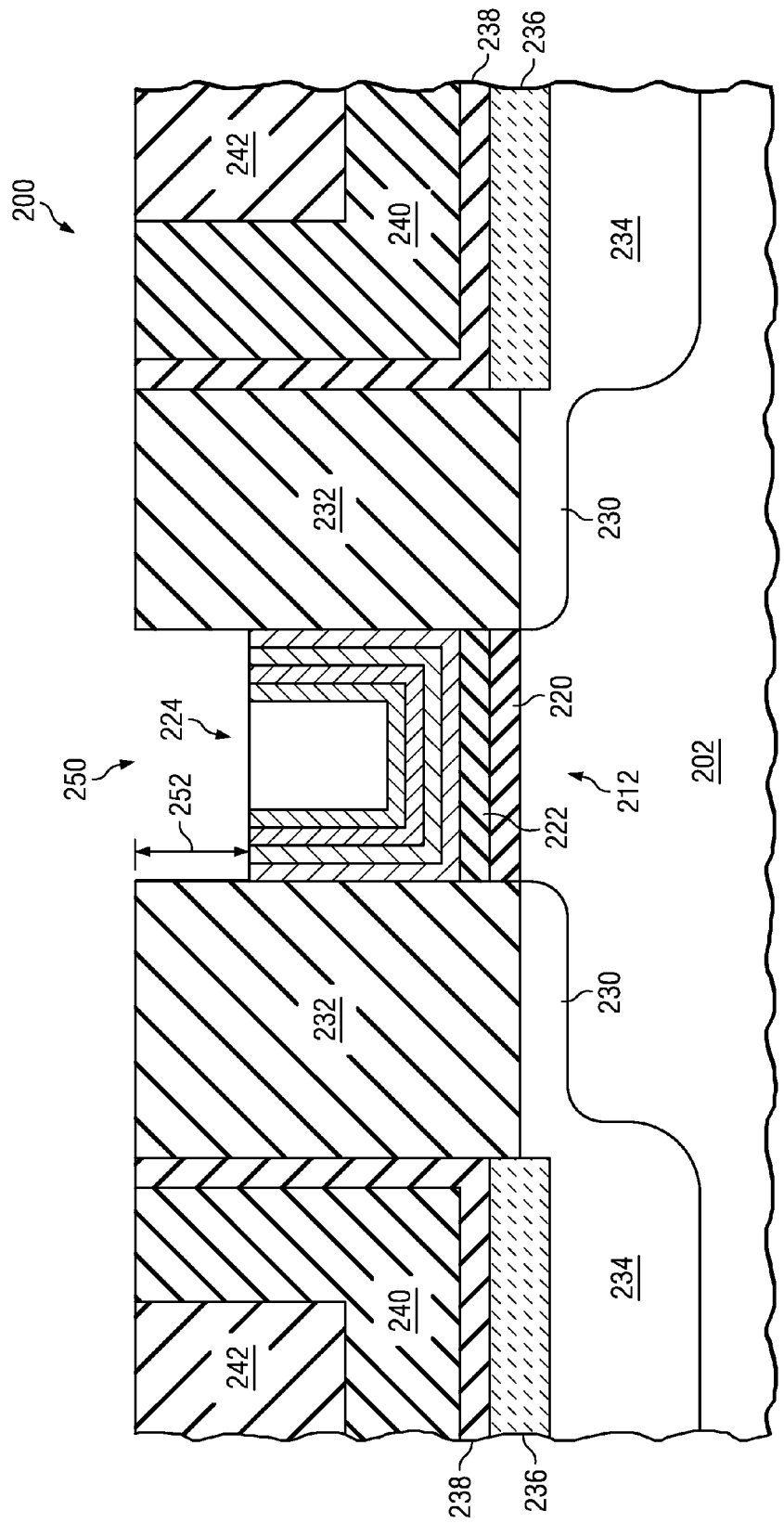

In FIG. 2B, illustrated is the nFET 212 of the semiconductor device 200 for the sake of simplicity and clarity. Although not shown, it is understood that the gate electrode 226 of the pFET 214 undergoes the same processing that modifies the gate electrode 224 of the nFET 212. A portion of the gate electrode 224 is removed by an etching process. The etching process may include a dry etching process and/or a wet etching process. For example, the dry/wet etching chemistry may include Cl, F, and Br based etchants to selectively remove the various metal layers. The etching process forms a trench 250 within the gate electrode 224. The trench 250 may have a depth 252 ranging from about 5 to about 50 nm. The depth 252 can be achieved by tuning various parameters of the etching process such as time and etching chemistry.

Figure 2C:
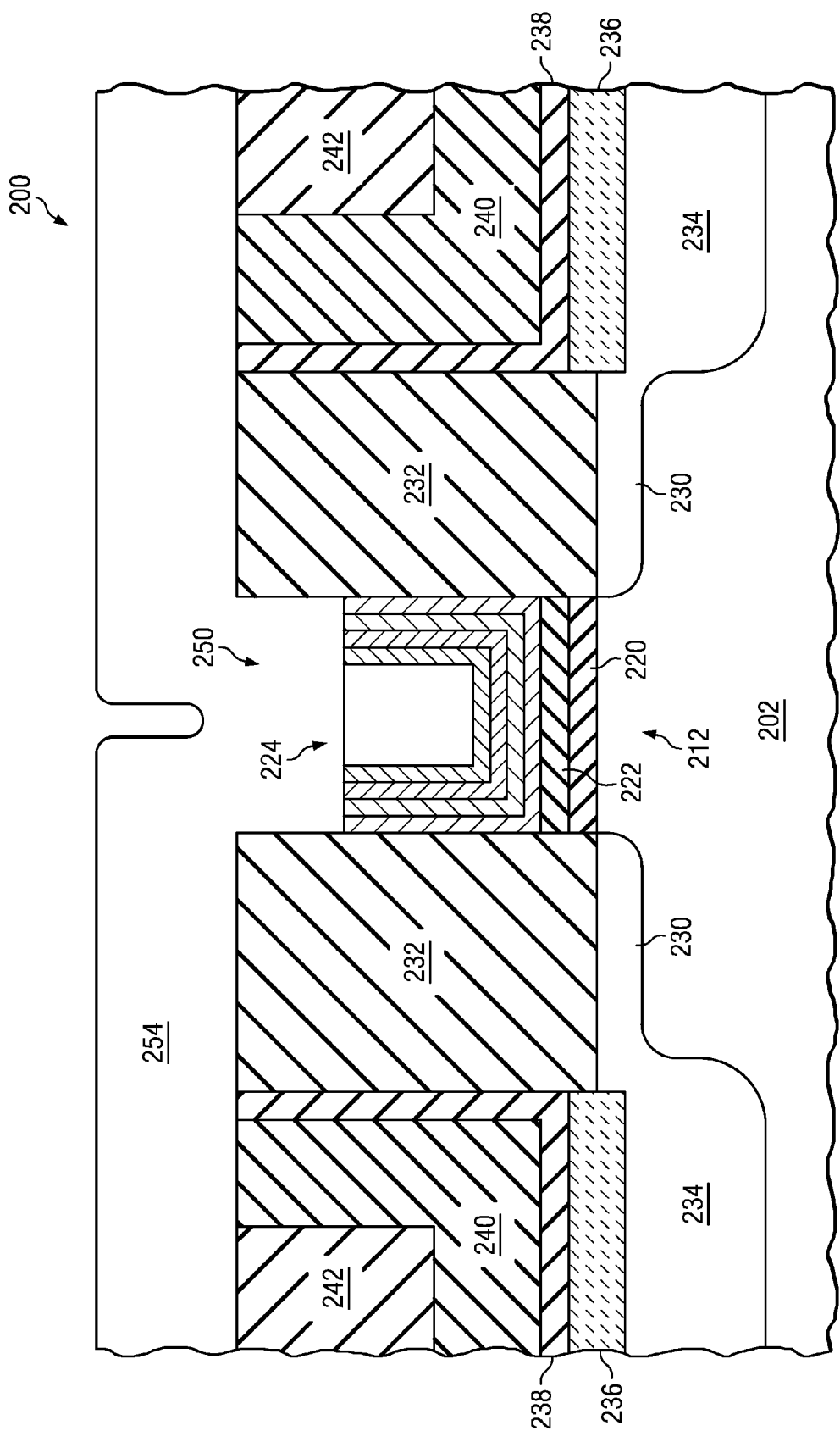

In FIG. 2C, an amorphous layer 254 is formed filling in the trench. The amorphous layer 254 may include silicon (Si), silicon germanium (SiGe), and germanium (Ge). In the present embodiment, the amorphous layer 254 is formed of amorphous silicon. The amorphous layer 254 may be formed by a low temperature deposition process such as CVD. The deposition temperature ranges from about 25° C. (e.g., room temperature) to about 450° C. The thickness of the amorphous layer 254 will depend on the depth 252 of the trench 250. Accordingly, the amorphous layer 254 is deposited until the trench 250 is substantially filled. In some embodiments, a percentage of Ge may range from 5% to about 50%.

Figure 2D:
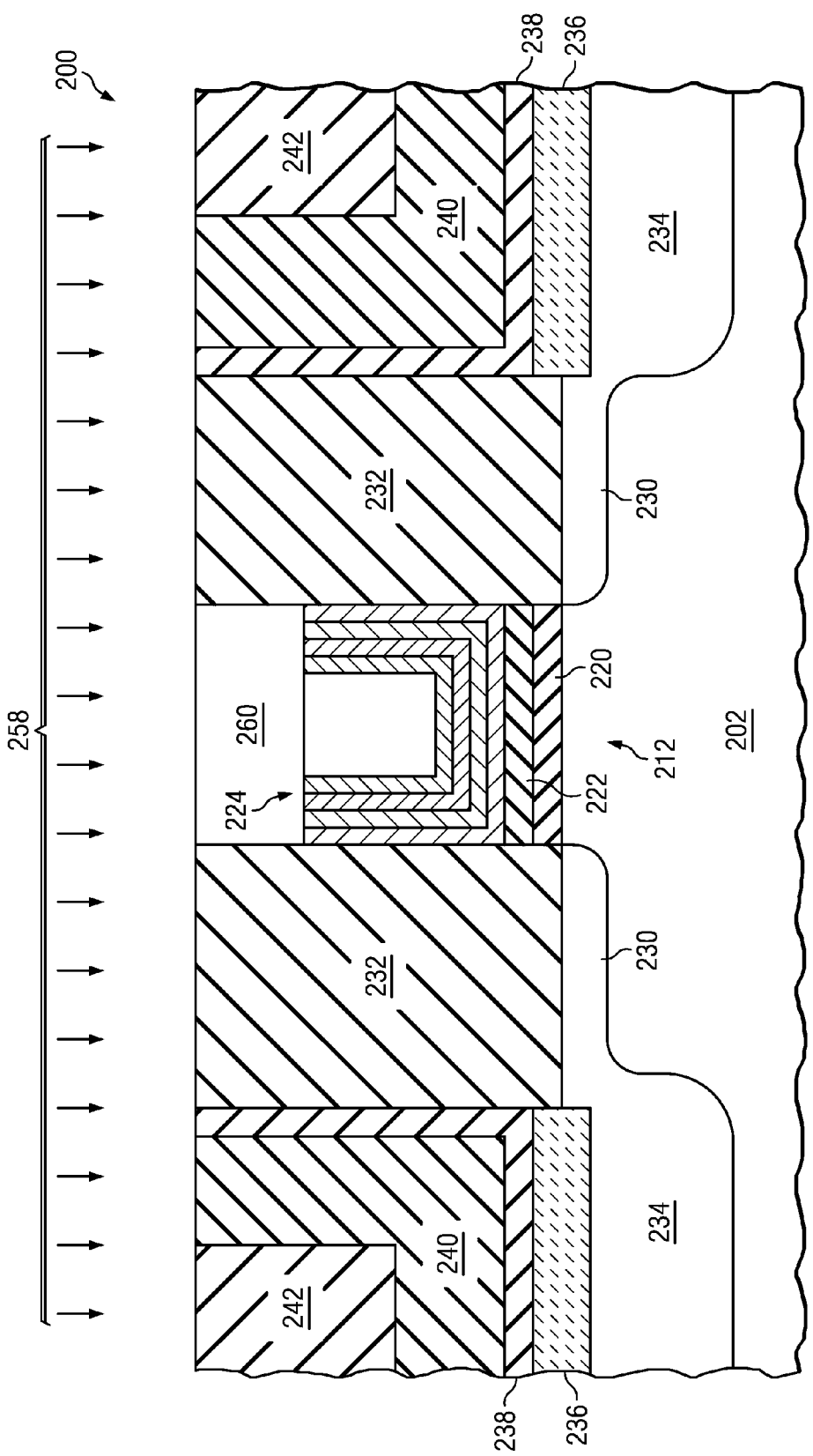

In FIG. 2D, a CMP 258 is performed to remove the amorphous layer 254 outside of the trench 250. Accordingly, the CMP process 258 may stop when reaching the ILD 242, and thus providing a substantially planar surface. Following the CMP 258, an amorphous layer 260 remains within the gate electrode 224.

Figure 2E:
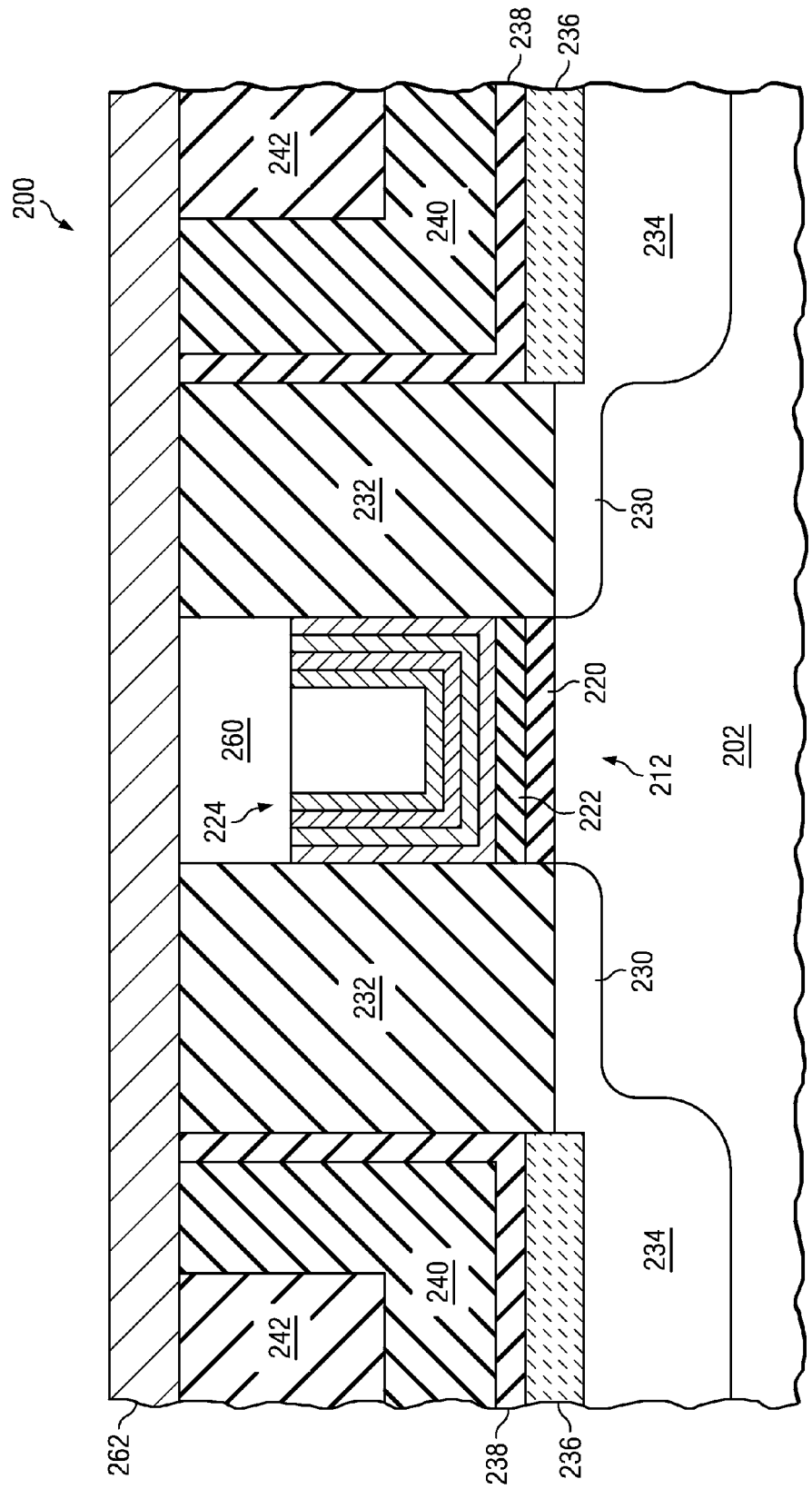

In FIG. 2E, a metal layer 262 is formed over the ILD 242 and the amorphous layer 260. In the present embodiment, the metal layer 262 includes nickel (Ni). Alternatively, the metal layer 262 may optionally include other metals such as cobalt, tungsten, tantalum, titanium, platinum, erbium, and palladium. The metal layer 262 may be formed by CVD, PVD, or other suitable techniques.

Figure 2F:
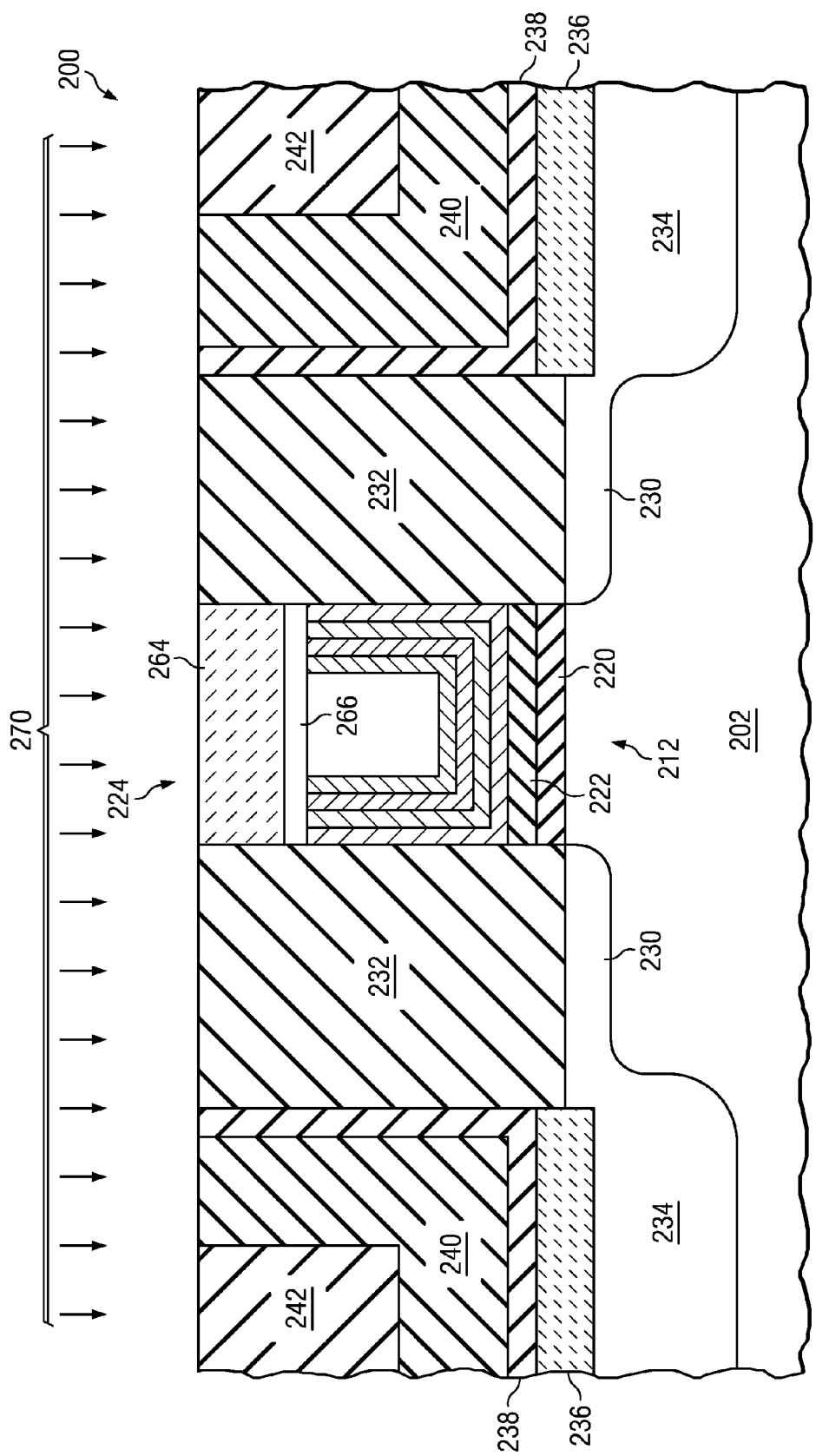

In FIG. 2F, a thermal process is performed to react the metal layer 262 and the amorphous layer 260. The thermal process includes a temperature ranging from about 200° C. to about 500° C. The reaction forms a metal silicide at the top portion of the gate electrode. In the present embodiment, the Ni reacts with the amorphous silicon to form a nickel silicide (NiSi) 264. It is noted that a bottom portion of the amorphous layer 266 may not react with the metal layer, and is disposed between the various metal layers (formed during gate last process) and the nickel silicide 264. Accordingly, the amorphous silicon may be doped during deposition to provide sufficient conductivity. Further, it is noted the process that forms the nickel silicide 264 is a self-aligned silicidation (salicidation) process. The metal layer next to the silicon reacts to form the metal silicide whereas the metal layer next to the silicon oxide and silicon nitride does not react. Thus, no extra masks are needed to form the nickel silicide 264. The un-reacted portions of the metal layer 262 may be removed by an etching process or CMP process 270.

It is understood that the semiconductor device 200 may undergo further CMOS process flow to form various features such as contacts/vias, interconnect metal layers, dielectric layers, passivation layers, etc. It has been observed that the nickel silicide 264 used as the gate contact material reduces the gate resistance of the nFET 212 and pFET 214. Additionally, it is noted that the nickel silicide 264 on the top portion of the gate electrode provides better selectivity during contact etch stop, and thus a larger process window for forming contacts to couple to the gate electrode is achieved. Moreover, the nickel silicide 264 can function as a stressor to stress the channel region of the nFET 212 and pFET 214 for better carrier mobility.

Figure 3:
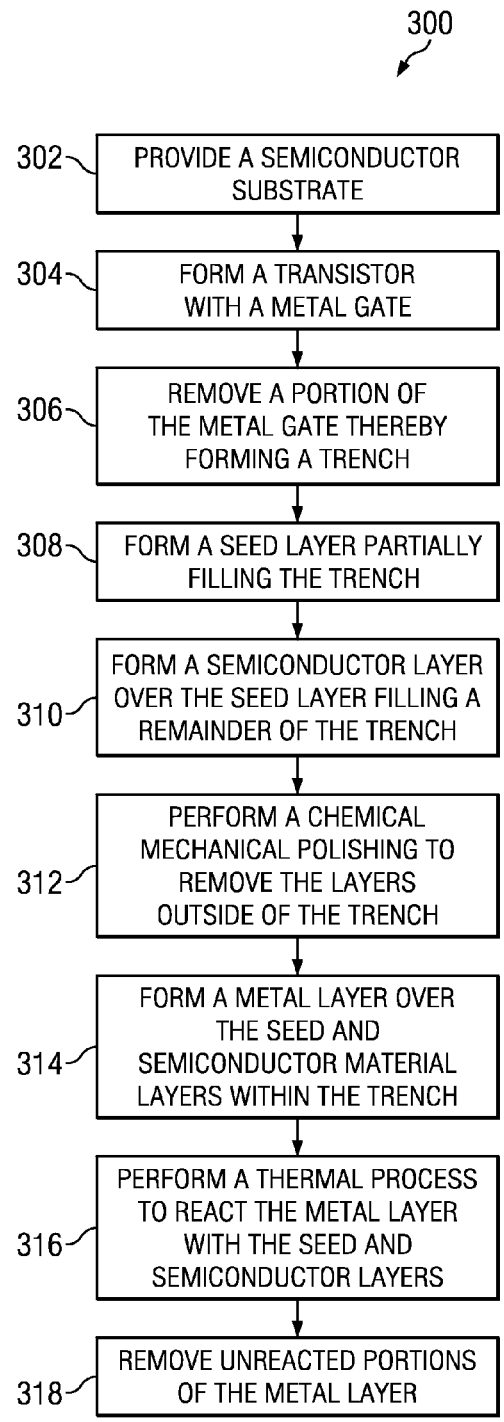
FIG. 3 is a flowchart illustrating another method of fabricating a semiconductor device with a metal gate according to various aspects of the present disclosure.

Referring to FIG. 3, illustrated is a flowchart of another method 300 for fabricating a semiconductor device with a metal gate according to various aspects of the present disclosure. The method 300 begins with block 302 in which a semiconductor substrate is provided. The method 300 continues with block 304 in which a transistor is formed with a metal gate. The method 300 continues with block 306 in which a portion of the metal gate is removed thereby forming a trench. The method 300 continues with block 308 in which a seed layer is formed partially filling the trench. The method 300 continues with block 310 in which a semiconductor material layer is formed filling a remainder of the trench. The method 300 continues with block 312 in which a chemical mechanical polishing is performed to remove the layers outside the trench. The method 300 continues with block 314 in which a metal layer is formed over the seed and semiconductor material layers within the trench. The method 300 continues with block 316 in which a thermal process is performed to react the metal layer with the seed and semiconductor material layers. The method 300 continues with block 318 in which the unreacted portions of the metal layer are removed. The discussion that follows illustrates an embodiments of a semiconductor device that can be fabricated according to the method 300 of FIG. 3.

Referring to FIGS. 4A-4F, illustrated are cross-sectional views of a semiconductor device 400 at various stages of fabrication according to the method 300 of FIG. 3. It is noted that part of the semiconductor device 400 may be fabricated with CMOS technology processing. Accordingly, it is understood that additional processes may be provided before, during, and after the method 300 of FIG. 3, and that some other processes may only be briefly described herein. Further, the semiconductor device 400 is similar to the semiconductor device 200 of FIG. 2. Accordingly, similar features in FIGS. 2 and 4 are numbered the same for the sake of clarity and simplicity. FIGS. 4A-4F illustrate an nFET 212 of the semiconductor device 400 for the sake of simplicity and clarity. Although not shown, it is understood that the gate electrode 226 of the pFET 214 (see FIG. 2A) undergoes the same processing that modifies the gate electrode 224 of the nFET 212.

Figure 4A:
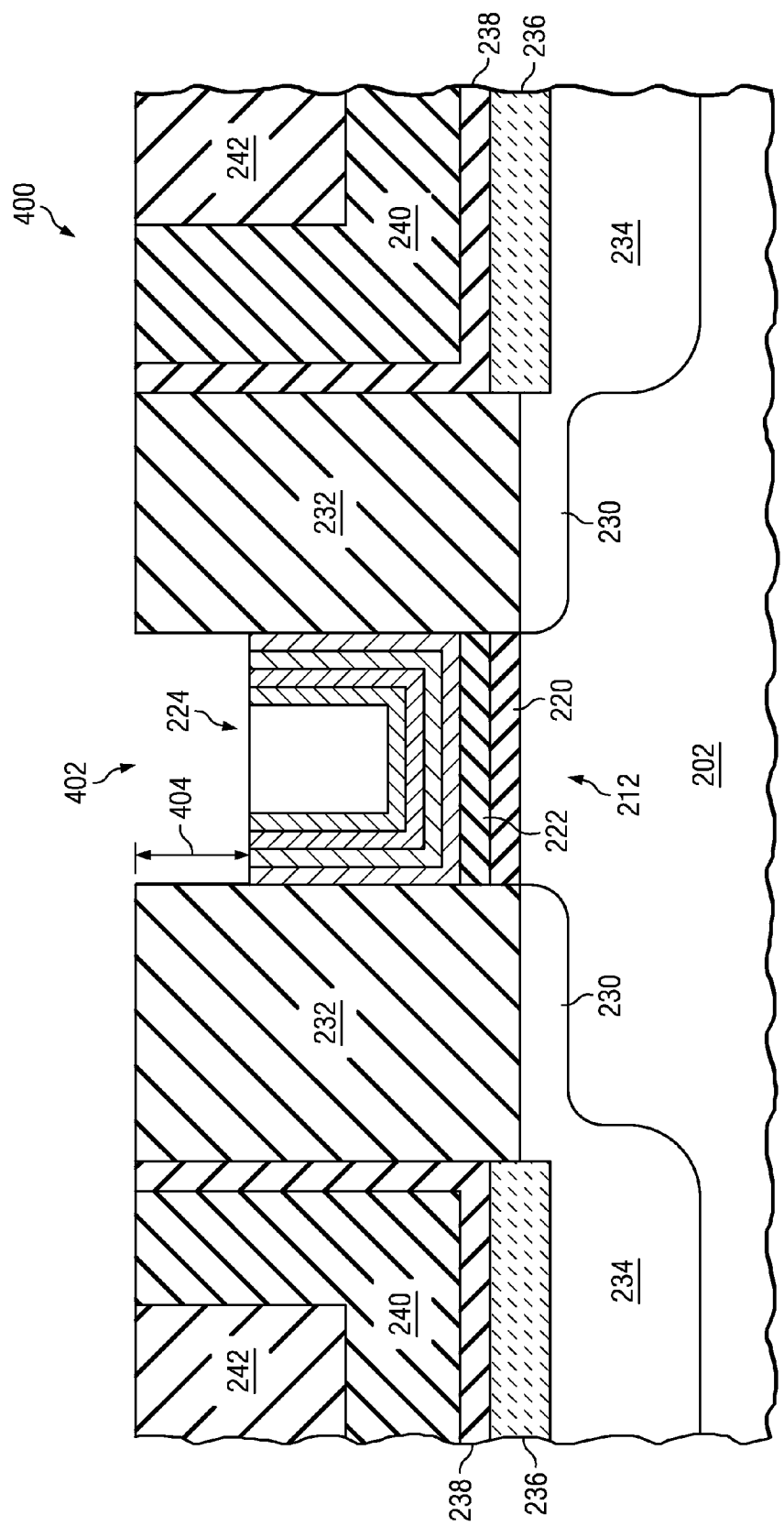
FIGS. 4A-4F are cross-sectional views of another embodiment of a semiconductor device at various stages of fabrication according to the method of FIG. 3.

In FIG. 4A, the semiconductor device 400 may include a semiconductor substrate 202 such as a silicon substrate. The semiconductor device 400 may further include an isolation structure 210 such as a shallow trench isolation (STI) feature formed in the substrate 202 for isolating active regions 212 and 214 in the substrate. The active region 212 may be configured for an nFET and the active region 214 may be configured for a pFET.

The nFET 212 and pFET 214 include a gate dielectric and a gate electrode. The formation of the gate includes forming various material layers, and etching/patterning the various material layers to form a gate stack of the nFET 212 and a gate stack of the pFET 214. The gate dielectric includes an interfacial layer 220 formed over the substrate 202. The interfacial layer 220 includes a silicon oxide layer (e.g., thermal or chemical oxide formation). The gate dielectric further includes a high-k dielectric layer 222 formed on the interfacial layer 220. The high-k dielectric layer 222 may be formed by atomic layer deposition (ALD) or other suitable technique.

As noted above, the nFET 212 and pFET 214 include gate electrodes 224, 226, respectively, that are formed of various metal layers in a gate last process. The various metal layers include barrier layers, liner layers, n-type or p-type work function metal layers, and fill metal layers. For example, the metal layers include, but are not limited to, Ta, TaN, TiAl, TiN, Ti, Al, W, and WN. The gate electrode 224 is configured to perform an n-type effective work function and the gate electrode 226 is configured to perform a p-type effective work function.

It has been observed that the metal gates of the nFET and pFET exhibit high gate resistance (e.g., 100 ohm/$\mu m^2$) due to the various metal layers (e.g., barrier layers, work function metal layers, liner layers, wetting layers, fill metal layers, etc.) formed in the respective devices. This can increase RC delay of the circuit and degrade device performance. Accordingly, the processing discussed below modifies the gate electrodes 224, 226 to reduce the gate resistance by one order of magnitude and improve subsequent processing of the semiconductor device 400.

It is noted that the semiconductor device 400 may undergo other CMOS technology processing to form various features of the nFET 212 and pFET 214 as is known in the art. As such, the various features are only briefly discussed herein. The various features are formed prior to formation of the gate electrodes 224, 226 in a gate last process. The various features may include lightly doped source/drain regions (n-type and p-type LDD) 230, sidewall or gate spacers 232, source/drain (n-type and p-type S/D) regions 234, silicide features 236, oxide layer 238, contact etch stop layer (CESL) 240, and an inter-level dielectric (ILD or specified as ILD0) 242. The n-type LDD and S/D regions may be doped with P or As, and the p-type LDD and S/D regions may be doped with B or In. The sidewall spacers 232 may be formed of silicon nitride or other suitable materials. The silicide features 236 may be formed by a self-aligned silicidation (salicidation) process. The CESL 240 may be formed of silicon nitride, silicon oxynitride, or other suitable materials. The ILD 242 may include an oxide formed by a high aspect ratio process (HARP) and/or high density plasma (HDP) deposition process.

A portion of the gate electrode 224 is removed by an etching process. The etching process may include a dry etching process and/or a wet etching process. For example, the dry/wet etching chemistry may include Cl, F, and Br based etchants to selectively remove the various metal layers. The etching process forms a trench 402 within the gate electrode 224. The trench 402 may have a depth 404 ranging from about 5 to about 50 nm. The depth 404 can be achieved by tuning various parameters of the etching process such as time and etching chemistry.

Figure 4B:
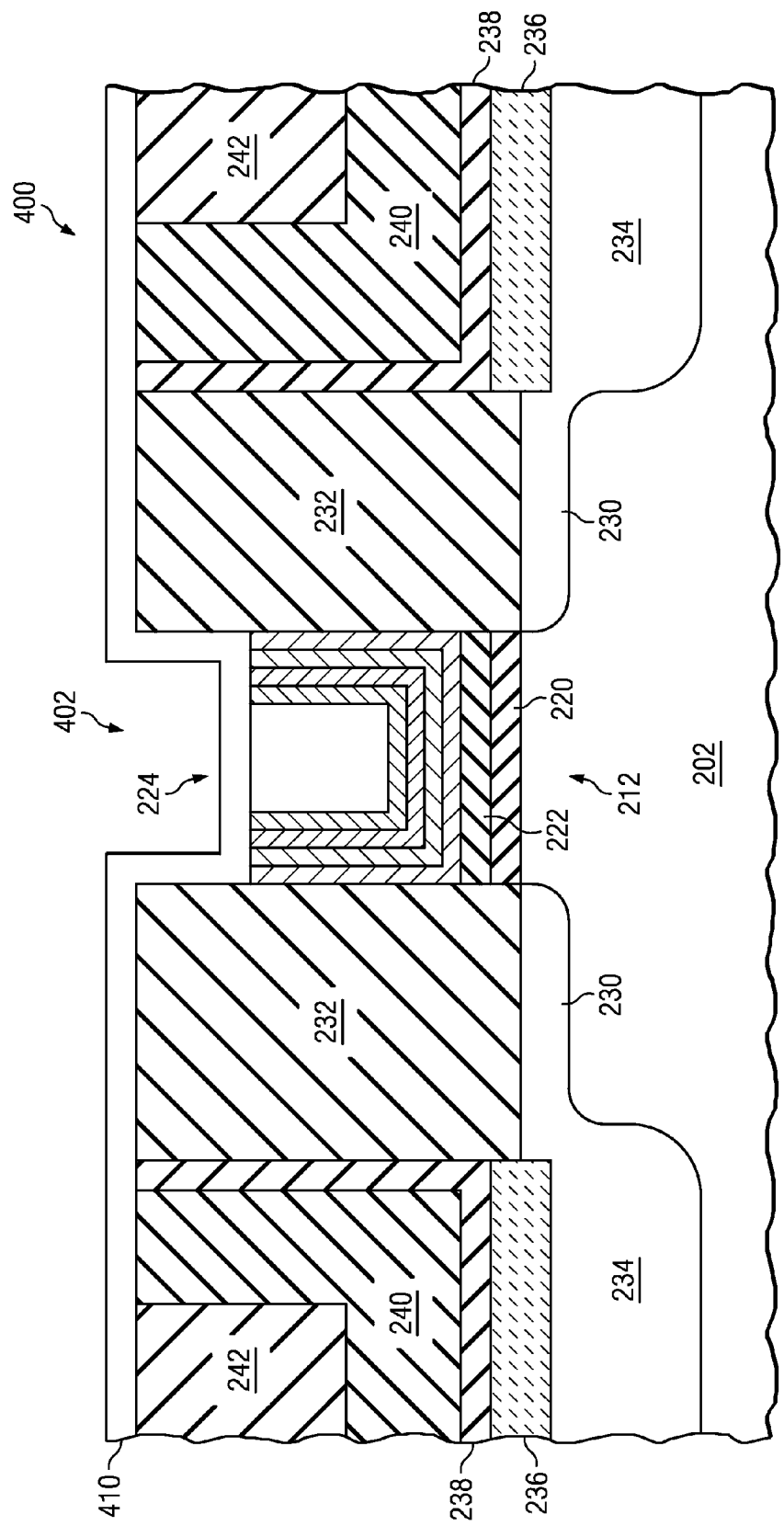

In FIG. 4B, a seed layer 410 is formed partially filling in the trench 402. In the present embodiment, the seed layer 410 includes silicon (Si). The Si seed layer may be formed by a low temperature deposition process such as CVD. The deposition temperature ranges from about 25° C. (e.g., room temperature) to about 450° C. The thickness of the seed layer 410 will depend on the depth 404 of the trench 402.

Figure 4C:
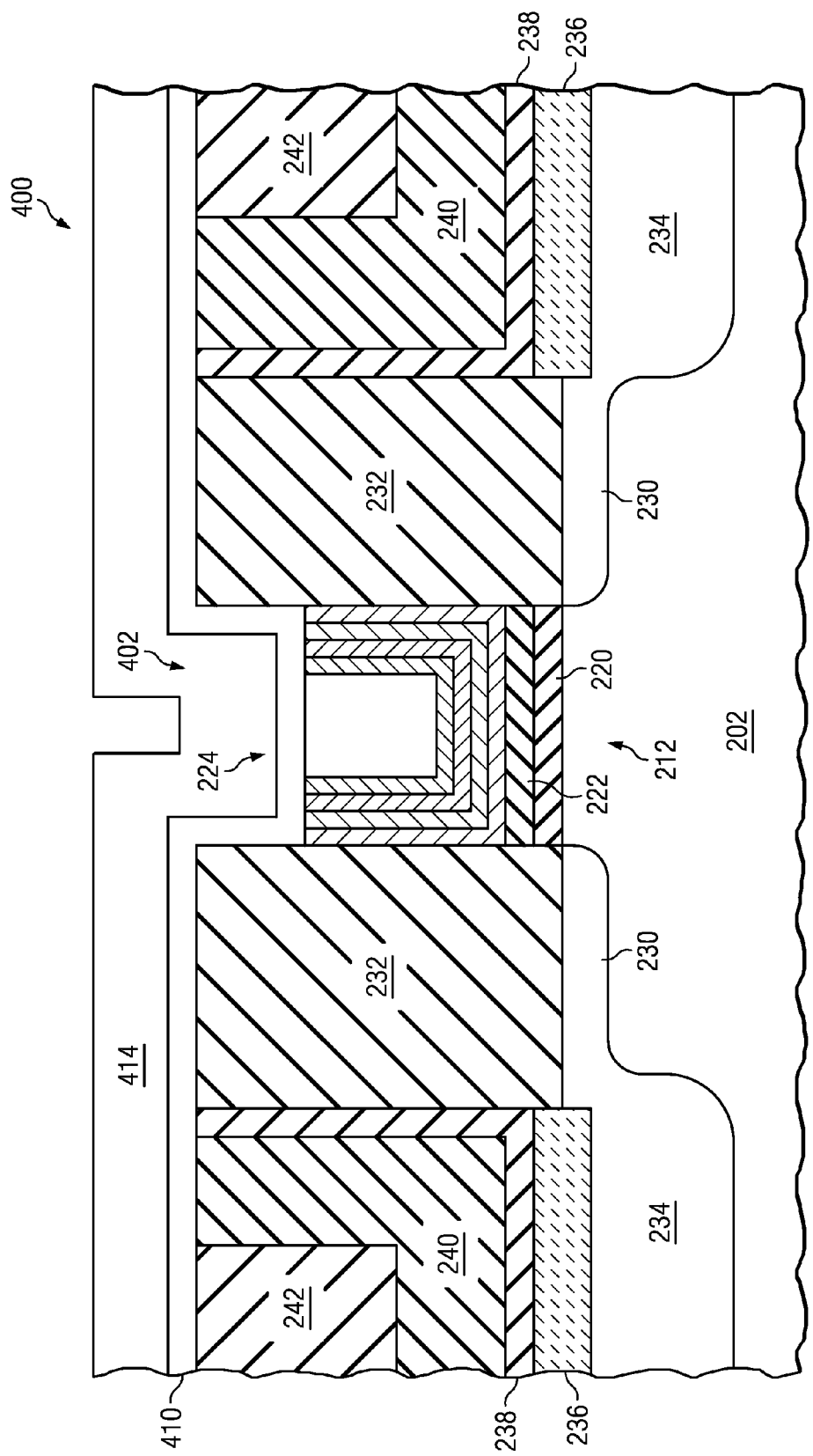

In FIG. 4C, a semiconductor material layer 414 is formed over the seed layer 410 filling in a remainder of trench 402. In the present embodiment, the semiconductor material layer 414 includes silicon germanium (SiGe). The SiGe layer may be deposited by an epitaxy process or other suitable technique. The thickness of the semiconductor material layer 414 will depend on the depth 404 of the trench 402. Accordingly, the SiGe is deposited until the trench 402 is substantially filled. In some embodiments, a percentage of Ge may range from 5% to about 50%.

Figure 4D:
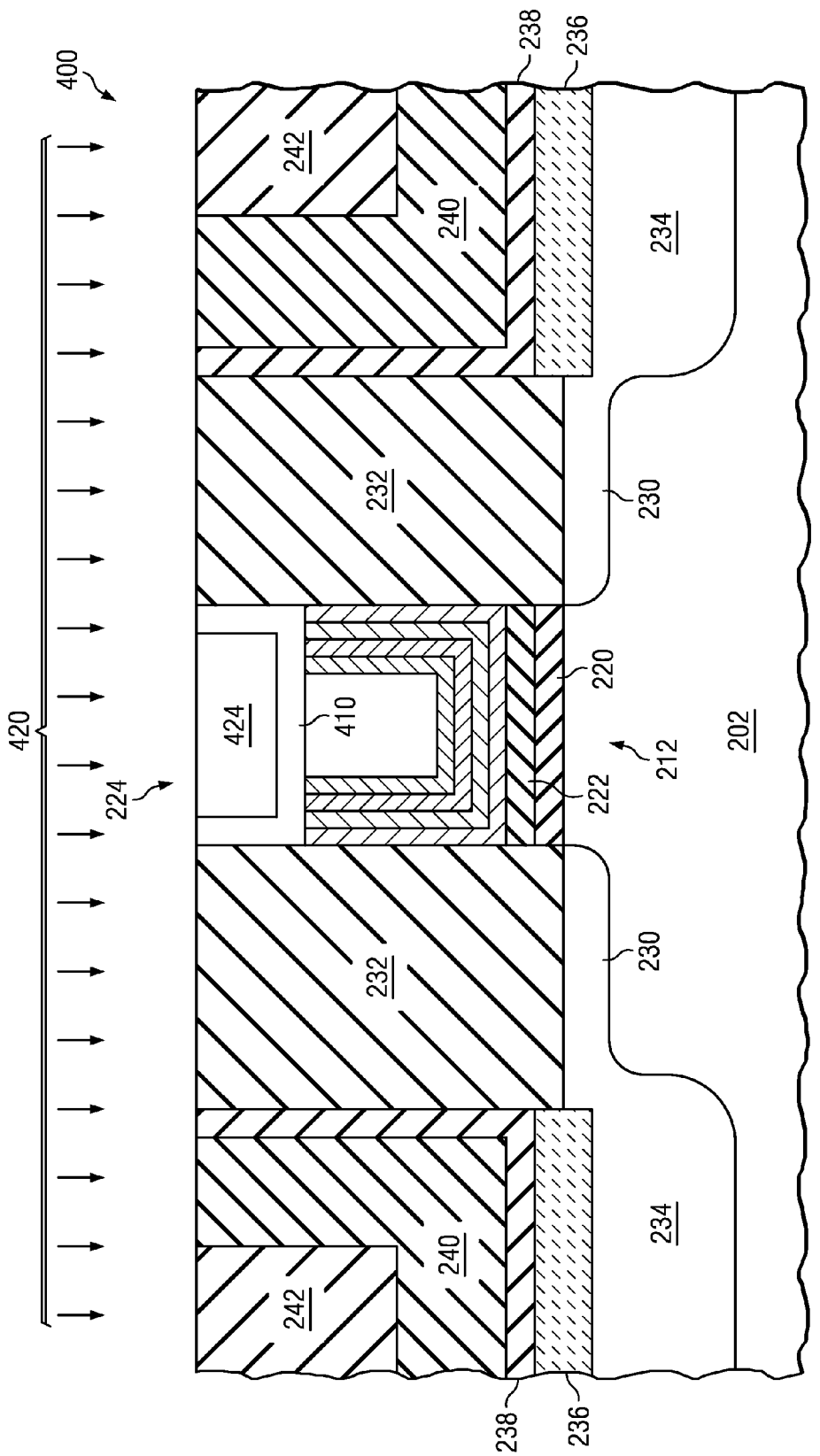

In FIG. 4D, a CMP 420 is performed to remove the seed and semiconductor material layers 410, 414 outside of the trench 402. Accordingly, the CMP process 420 may stop when reaching the ILD 242, and thus providing a substantially planar surface. Following the CMP 420, portions of the seed and semiconductor material layers 424 remains within the gate electrode 224.

Figure 4E:
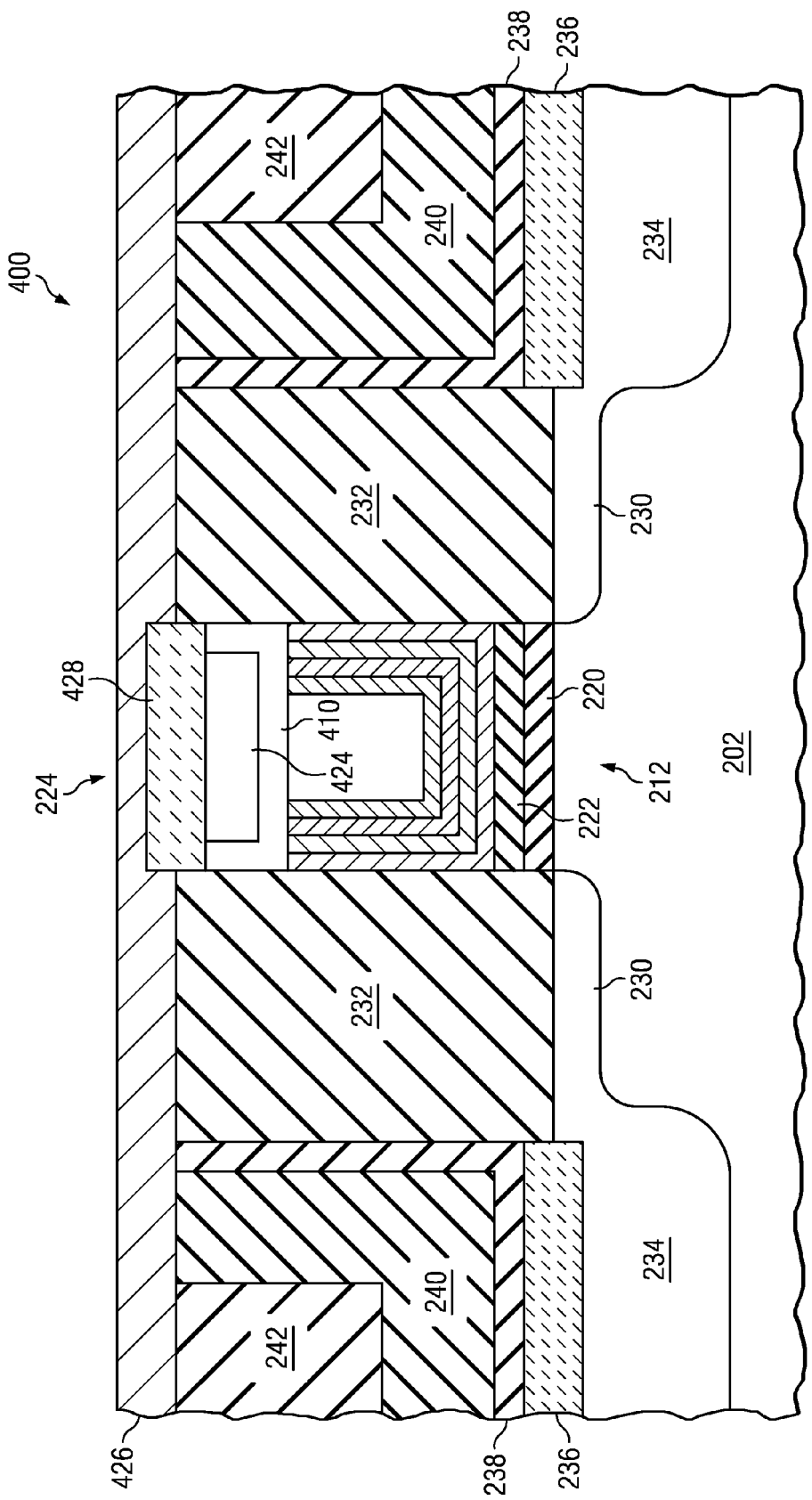

In FIG. 4E, a metal layer 426 is formed over the ILD 242 and the remaining seed and semiconductor material layers 424. In the present embodiment, the metal layer 426 includes nickel (Ni). Alternatively, the metal layer 426 may optionally include other metals such as cobalt, tungsten, tantalum, titanium, platinum, erbium, and palladium. The metal layer 426 may be formed by CVD, PVD, or other suitable techniques. A thermal process is performed to react the metal layer 426 with the seed and semiconductor material layers 424 within the gate electrode. The thermal process includes a temperature ranging from about 200° C. to about 500° C. The reaction forms a metal silicide at the top portion of the gate electrode. In the present embodiment, the Ni reacts with the silicon of the seed and semiconductor layers to form a nickel silicide (NiSi) 428 at the top portion of the gate electrode 224. It is noted that a portion of the seed and semiconductor material layers 424 may not react with the metal layer and are disposed between the various metal layers (formed during gate last process) and the nickel silicide 428. Accordingly, the seed and semiconductor material layers may be doped during deposition to provide sufficient conductivity. Further, it is noted this is a self-aligned silicidation (salicidation) process since the metal layer that is next to the silicon reacts to form the metal silicide whereas the metal layer next to the silicon oxide and silicon nitride does not react.

Figure 4F:
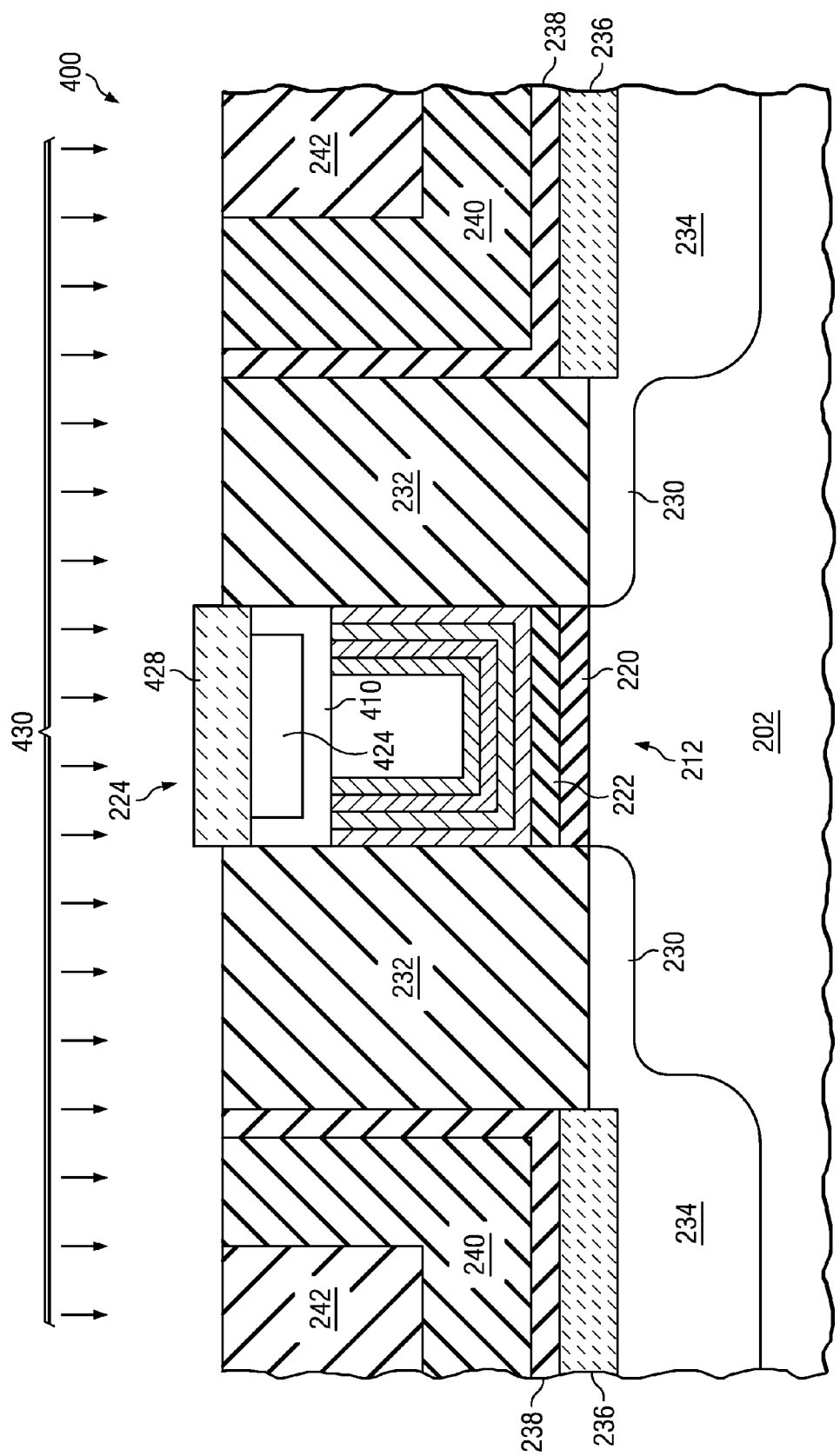

In FIG. 4F, the un-reacted portions of the metal layer 426 may be removed by an etching process or CMP process 430. It is understood that the semiconductor device 400 may undergo further CMOS process flow to form various features such as contacts/vias, interconnect metal layers, dielectric layers, passivation layers, etc. It has been observed that the nickel silicide 428 used as the gate contact material reduces the gate resistance of the nFET 212 and pFET 214. Additionally, it is noted that the nickel silicide 428 on the top portion of the gate electrode provides better selectivity during contact etch stop, and thus a larger process window for forming contacts to couple to the gate electrode is achieved. Moreover, the nickel silicide 428 can function as a stressor to stress the channel region of the nFET 212 and pFET 214 for better carrier mobility.

Figure 5:
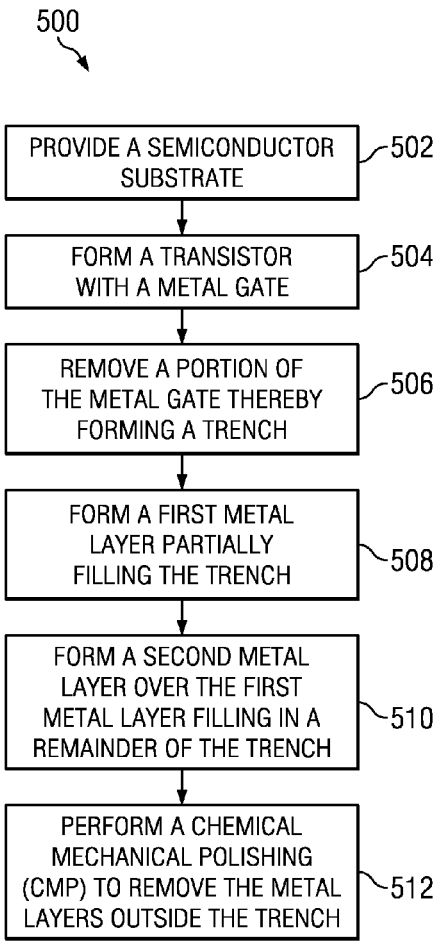
FIG. 5 is a flowchart illustrating another method of fabricating a semiconductor device with a metal gate according to various aspects of the present disclosure.

Referring to FIG. 5, illustrated is a flowchart of another method 500 for fabricating a semiconductor device with a metal gate according to various aspects of the present disclosure. The method 500 begins with block 502 in which a semiconductor substrate is provided. The method 500 continues with block 504 in which a transistor is formed with a metal gate. The method 500 continues with block 506 in which a portion of the metal gate is removed thereby forming a trench. The method 500 continues with block 508 in which a first metal layer is formed partially filling the trench. The method 500 continues with block 510 in which a second metal layer is formed filling a remainder of the trench. The method 500 continues with block 512 in which a chemical mechanical polishing is performed to remove the metal layers outside the trench. The discussion that follows illustrates an embodiments of a semiconductor device that can be fabricated according to the method 500 of FIG. 5.

Referring to FIGS. 6A-6D, illustrated are cross-sectional views of a semiconductor device 600 at various stages of fabrication according to the method 500 of FIG. 5. It is noted that part of the semiconductor device 600 may be fabricated with CMOS technology processing. Accordingly, it is understood that additional processes may be provided before, during, and after the method 500 of FIG. 5, and that some other processes may only be briefly described herein. Further, the semiconductor device 600 is similar to the semiconductor device 200 of FIG. 2. Accordingly, similar features in FIGS. 2 and 6 are numbered the same for the sake of clarity and simplicity. FIGS. 6A-6D illustrate an nFET 212 of the semiconductor device 600 for the sake of simplicity and clarity. Although not shown, it is understood that the gate electrode 226 of the pFET 214 (see FIG. 2A) undergoes the same processing that modifies the gate electrode 224 of the nFET 212.

Figure 6A:
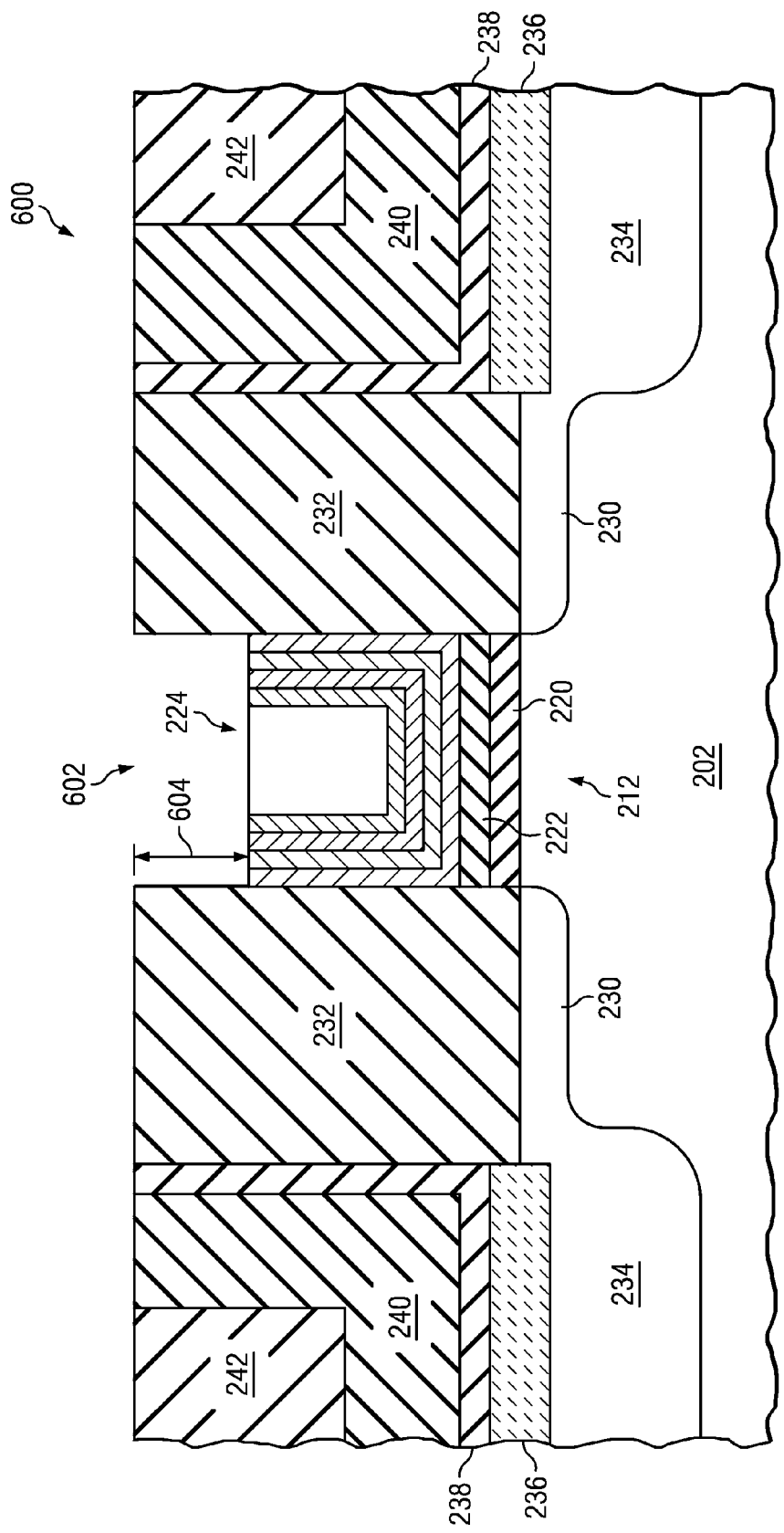
FIGS. 6A-6D are cross-sectional views of another embodiment of a semiconductor device at various stages of fabrication according to the method of FIG. 5.

In FIG. 6A, the semiconductor device 600 may include a semiconductor substrate 202 such as a silicon substrate. The semiconductor device 600 may further include an isolation structure 210 such as a shallow trench isolation (STI) feature formed in the substrate 202 for isolating active regions 212 and 214 in the substrate. The active region 212 may be configured for an nFET and the active region 214 may be configured for a pFET.

The nFET 212 and pFET 214 include a gate dielectric and a gate electrode. The formation of the gate includes forming various material layers, and etching/patterning the various material layers to form a gate stack of the nFET 212 and a gate stack of the pFET 214. The gate dielectric includes an interfacial layer 220 formed over the substrate 202. The interfacial layer 220 includes a silicon oxide layer (e.g., thermal or chemical oxide formation). The gate dielectric further includes a high-k dielectric layer 222 formed on the interfacial layer 220. The high-k dielectric layer 222 may be formed by atomic layer deposition (ALD) or other suitable technique.

As noted above, the nFET 212 and pFET 214 include gate electrodes 224, 226, respectively, that are formed of various metal layers in a gate last process. The various metal layers include barrier layers, liner layers, n-type or p-type work function metal layers, and fill metal layers. For example, the metal layers include, but are not limited to, Ta, TaN, TiAl, TiN, Ti, Al, W, and WN. The gate electrode 224 is configured to perform an n-type effective work function and the gate electrode 226 is configured to perform a p-type effective work function.

It has been observed that the metal gates of the nFET and pFET exhibit high gate resistance (e.g., 100 ohm/$\mu m^2$) due to the multiple metal layers (e.g., barrier layers, work function metal layers, liner layers, wetting layers, fill metal layers, etc.) formed in the respective devices. This can increase RC delay of the circuit and degrade device performance. Accordingly, the processing discussed below modifies the gate electrodes 224, 226 to reduce the gate resistance by about one order of magnitude and improve subsequent processing of the semiconductor device 600.

It is noted that the semiconductor device 600 may undergo other CMOS technology processing to form various features of the nFET 212 and pFET 214 as is known in the art. As such, the various features are only briefly discussed herein. The various features are formed prior to formation of the gate electrodes 224, 226 in a gate last process. The various features may include lightly doped source/drain regions (n-type and p-type LDD) 230, sidewall or gate spacers 232, source/drain (n-type and p-type S/D) regions 234, silicide features 236, oxide layer 238, contact etch stop layer (CESL) 240, and an inter-level dielectric (ILD or specified as ILD0) 242. The n-type LDD and S/D regions may be doped with P or As, and the p-type LDD and S/D regions may be doped with B or In. The sidewall spacers 232 may be formed of silicon nitride or other suitable materials. The silicide features 236 may be formed by a self-aligned silicidation (salicidation) process. The CESL 240 may be formed of silicon nitride, silicon oxynitride, or other suitable materials. The ILD 242 may include an oxide formed by a high aspect ratio process (HARP) and/or high density plasma (HDP) deposition process.

A portion of the gate electrode 224 is removed by an etching process. The etching process may include a dry etching process and/or a wet etching process. For example, the dry/wet etching chemistry may include Cl, F, and Br based etchants to selectively remove the various metal layers. The etching process forms a trench 602 within the gate electrode 224. The trench 602 may have a depth 604 ranging from about 5 to about 50 nm. The depth 604 can be achieved by tuning various parameters of the etching process such as time and etching chemistry.

Figure 6B:
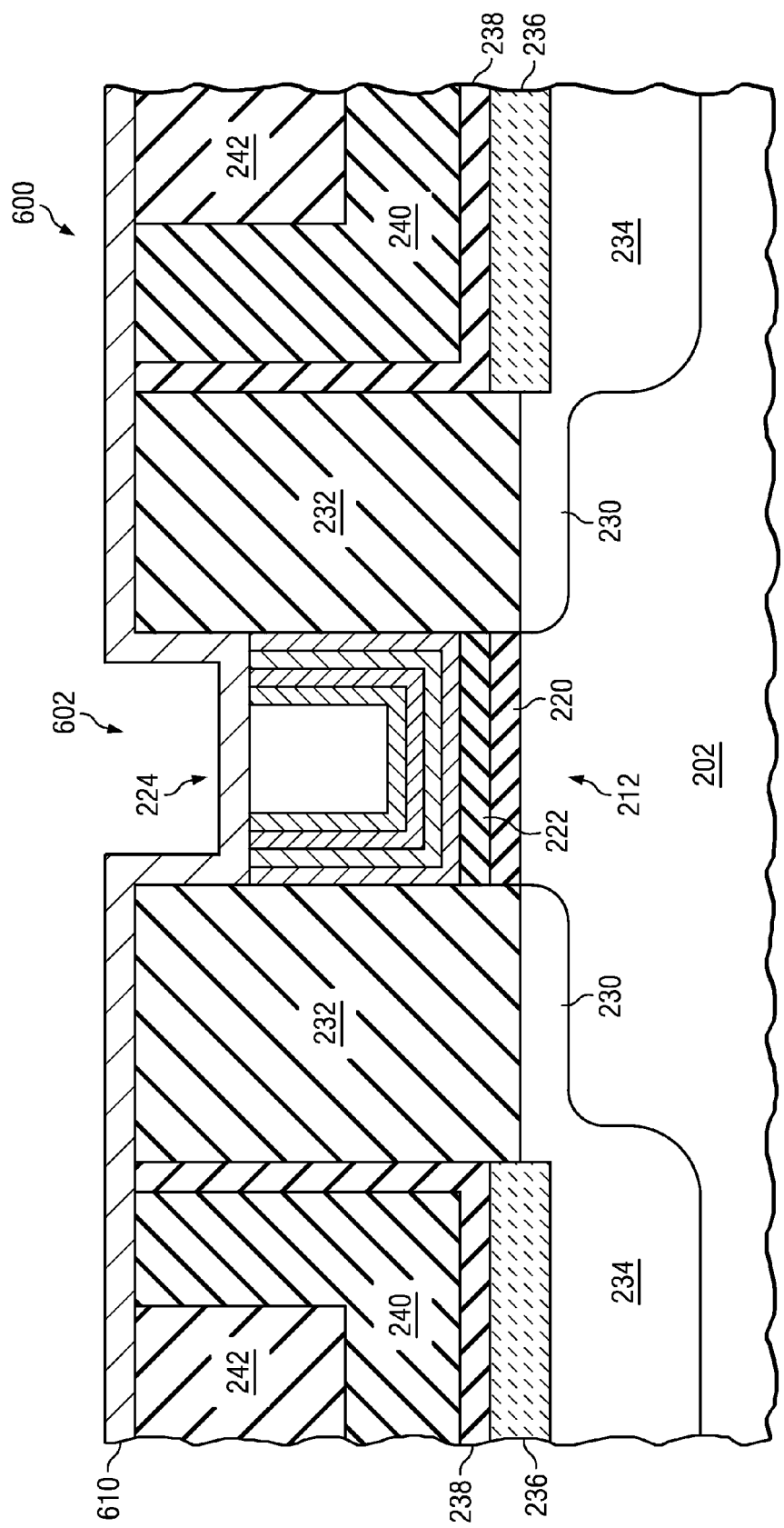

In FIG. 6B, a metal layer 610 is formed partially filling the trench 602. In the present embodiment, the metal layer 610 includes TaN. In other embodiments, the metal layer 610 alternatively includes a compound of TaN, TiN, compound of TiN, or other suitable metal. The thickness of the metal layer 610 ranges from about 5 angstrom (A) to about 5 nm. The metal layer 610 is formed by ALD. In other embodiments, the metal layer 610 may be formed by CVD, PVD, or other suitable technique.

Figure 6C:
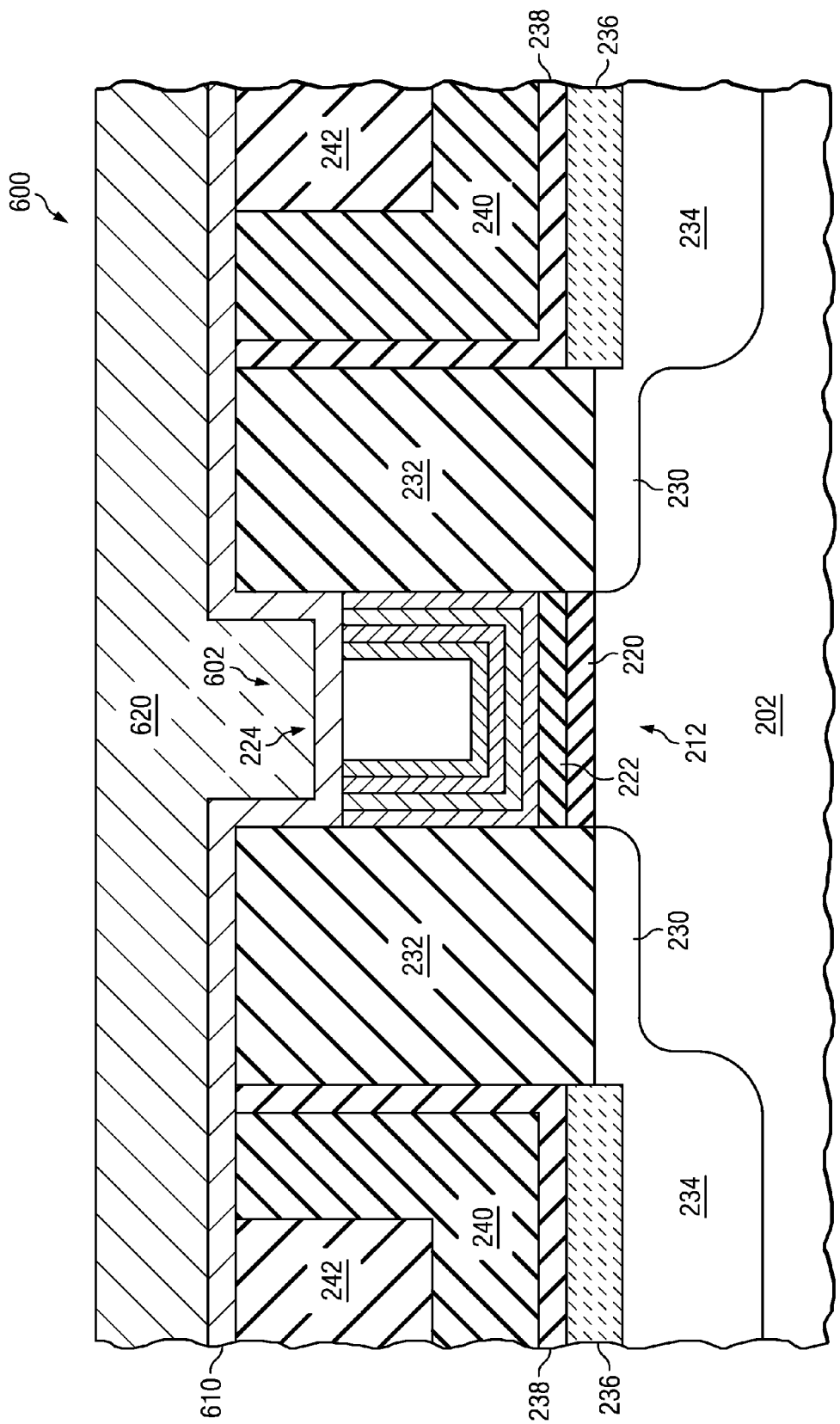

In FIG. 6C, a metal layer 620 is formed over the metal layer 610 filling in a remainder of trench 602. In the present embodiment, the metal layer 620 includes Cu. In other embodiments, the metal layer 620 includes W or Al. The metal layer 620 is formed by CVD. In other embodiments, the metal layer 620 may be formed by PVD, or other suitable technique. The thickness of the metal layer 620 will depend on the depth 604 of the trench 602. Accordingly, the metal layer 620 is deposited until the trench 602 is substantially filled.

Figure 6D:
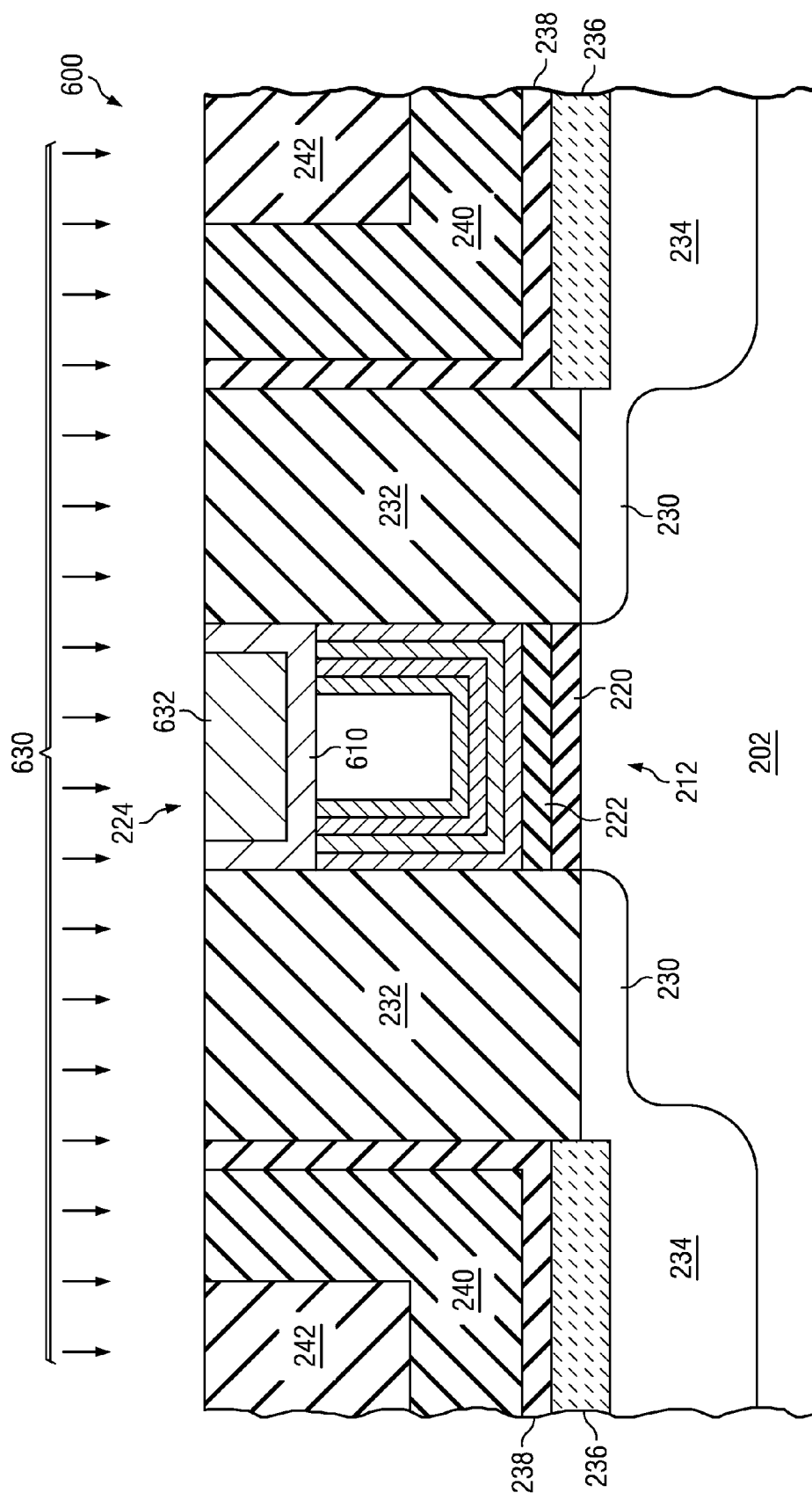

In FIG. 6D, a CMP 630 is performed to remove portions of the metal layers 610, 620 outside of the trench 602. Accordingly, the CMP process 630 may stop when reaching the ILD 242, and thus providing a substantially planar surface. Following the CMP 630, portions of the metal layers 632 remains within the gate electrode 224. It is understood that the semiconductor device 600 may undergo further CMOS process flow to form various features such as contacts/vias, interconnect metal layers, dielectric layers, passivation layers, etc. It has been observed that the metal structure 632 used as the gate contact material reduces the gate resistance of the nFET 212 and pFET 214. Additionally, it is noted that the metal structure 632 on the top portion of the gate electrode provides better selectivity during contact etch stop, and thus a larger process window for forming contacts to couple to the gate electrode is achieved. Moreover, the metal structure 632 can function as a stressor to stress the channel region of the nFET 212 and pFET 214 for better carrier mobility.

Figure 7:
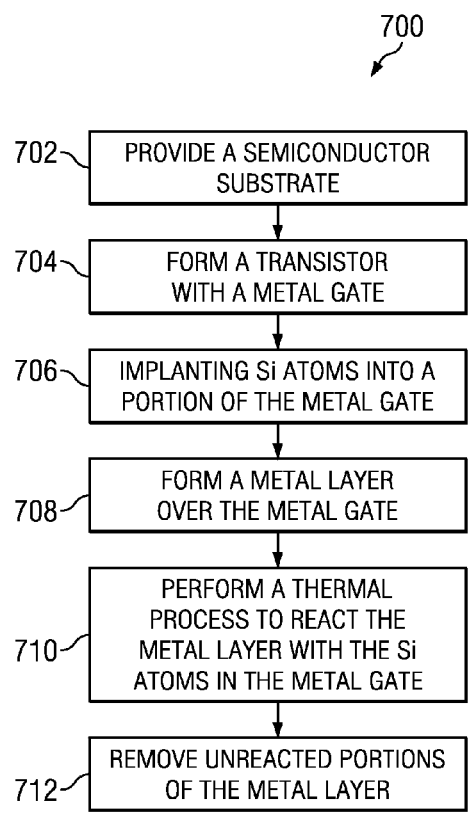
FIG. 7 is a flowchart illustrating another method of fabricating a semiconductor device with a metal gate according to various aspects of the present disclosure.

Referring to FIG. 7, illustrated is a flowchart of another method 700 for fabricating a semiconductor device with a metal gate according to various aspects of the present disclosure. The method 700 begins with block 702 in which a semiconductor substrate is provided. The method 700 continues with block 704 in which a transistor is formed with a metal gate. The method 700 continues with block 706 in which Si atoms are implanted into a portion of the metal gate. The method 700 continues with block 708 in which a metal layer over the metal gate. The method 700 continues with block 710 in which a thermal process is performed to react the metal layer with the Si atoms in the metal gate. The method 700 continues with block 712 in which the unreacted portions of the metal layer are removed. The discussion that follows illustrates various embodiments of a semiconductor device that can be fabricated according to the method 700 of FIG. 7.

Referring to FIGS. 8A-8D, illustrated are cross-sectional views of a semiconductor device 800 at various stages of fabrication according to the method 700 of FIG. 7. It is noted that part of the semiconductor device 800 may be fabricated with CMOS technology processing. Accordingly, it is understood that additional processes may be provided before, during, and after the method 700 of FIG. 7, and that some other processes may only be briefly described herein. Further, the semiconductor device 800 is similar to the semiconductor device 200 of FIG. 2. Accordingly, similar features in FIGS. 2 and 7 are numbered the same for the sake of clarity and simplicity. FIGS. 8A-8D illustrate an nFET 212 of the semiconductor device 800 for the sake of simplicity and clarity. Although not shown, it is understood that the gate electrode 226 of the pFET 214 (see FIG. 2A) undergoes the same processing that modifies the gate electrode 224 of the nFET 212.

Figure 8A:
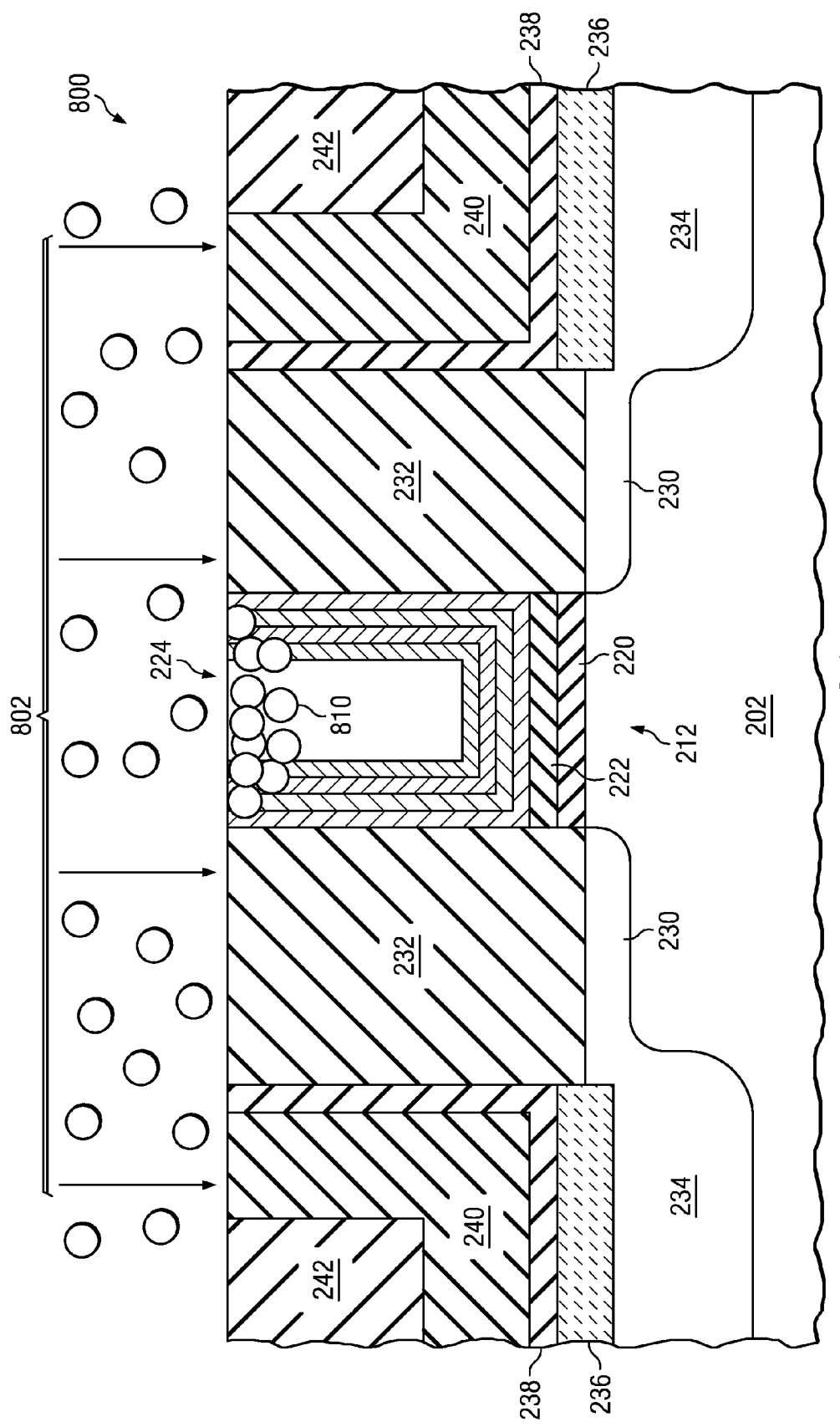
FIGS. 8A-8D are cross-sectional views of another embodiment of a semiconductor device at various stages of fabrication according to the method of FIG. 7.

In FIG. 8A, the semiconductor device 800 may include a semiconductor substrate 202 such as a silicon substrate. The semiconductor device 800 may further include an isolation structure 210 such as a shallow trench isolation (STI) feature formed in the substrate 202 for isolating active regions 212 and 214 in the substrate. The active region 212 may be configured for an nFET and the active region 214 may be configured for a pFET.

The nFET 212 and pFET 214 include a gate dielectric and a gate electrode. The formation of the gate includes forming various material layers, and etching/patterning the various material layers to form a gate stack of the nFET 212 and a gate stack of the pFET 214. The gate dielectric includes an interfacial layer 220 formed over the substrate 202. The interfacial layer 220 includes a silicon oxide layer (e.g., thermal or chemical oxide formation). The gate dielectric further includes a high-k dielectric layer 222 formed on the interfacial layer 220. The high-k dielectric layer 222 may be formed by atomic layer deposition (ALD) or other suitable technique.

As noted above, the nFET 212 and pFET 214 include gate electrodes 224, 226, respectively, that are formed of various metal layers in a gate last process. The various metal layers include barrier layers, liner layers, n-type or p-type work function metal layers, and fill metal layers. For example, the metal layers include, but are not limited to, Ta, TaN, TiAl, TiN, Ti, Al, W, and WN. The gate electrode 224 is configured to perform an n-type effective work function and the gate electrode 226 is configured to perform a p-type effective work function.

It has been observed that the metal gates of the nFET and pFET exhibit high gate resistance (e.g., 100 ohm/μm$^2$) due to the various metal layers (e.g., barrier layers, work function metal layers, liner layers, wetting layers, fill metal layers, etc.) formed in the respective devices. This can increase RC delay of the circuit and degrade device performance. Accordingly, the processing discussed below modifies the gate electrodes 224, 226 to reduce the gate resistance by one order of magnitude and improve subsequent processing of the semiconductor device 800.

It is noted that the semiconductor device 800 may undergo other CMOS technology processing to form various features of the nFET 212 and pFET 214 as is known in the art. As such, the various features are only briefly discussed herein. The various features are formed prior to formation of the gate electrodes 224, 226 in a gate last process. The various features may include lightly doped source/drain regions (n-type and p-type LDD) 230, sidewall or gate spacers 232, source/drain (n-type and p-type S/D) regions 234, silicide features 236, oxide layer 238, contact etch stop layer (CESL) 240, and an inter-level dielectric (ILD or specified as ILD0) 242. The n-type LDD and S/D regions may be doped with P or As, and the p-type LDD and S/D regions may be doped with B or In. The sidewall spacers 232 may be formed of silicon nitride or other suitable materials. The silicide features 236 may be formed by a self-aligned silicidation (salicidation) process. The CESL 240 may be formed of silicon nitride, silicon oxynitride, or other suitable materials. The ILD 242 may include an oxide formed by a high aspect ratio process (HARP) and/or high density plasma (HDP) deposition process.

An implantation process 802 is performed to implant Si ions or atoms 810 into a top portion of the gate electrode 224. The implantation process 802 utilizes a dosage ranging from about 5E15 atoms/cm$^2$ to about 5E17 atoms/cm$^2$. It is noted that the Si atoms are soluble in silicon oxide and silicon nitride of the respective sidewall spacers 232, oxide layer 238, CESL 240, and the IDL 242, and thus those structures are not degraded by the implantation process 802. In other embodiments, the implantation process may also include Ge atoms.

Figure 8B:
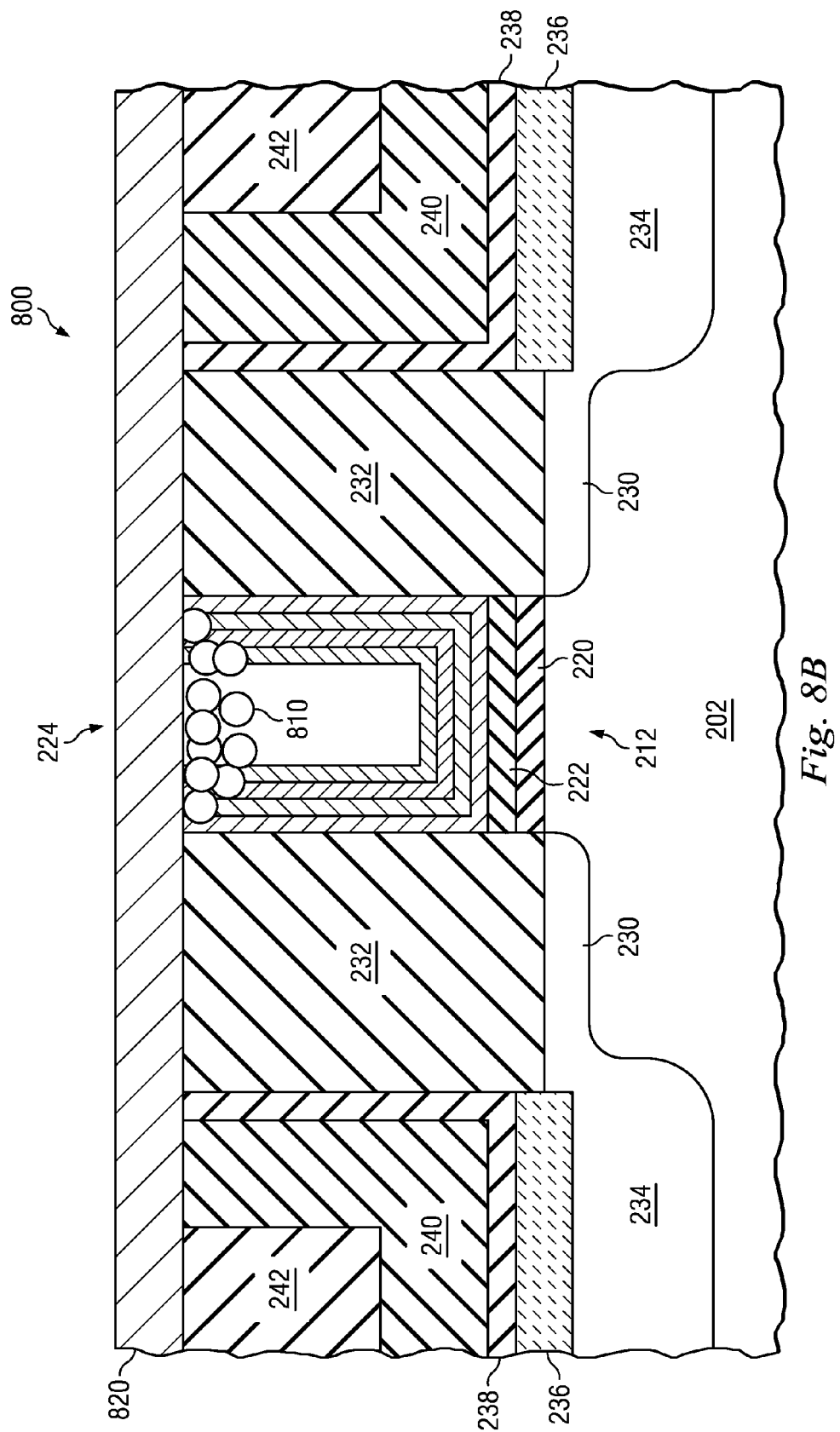

In FIG. 8B, a metal layer 820 is formed over the ILD 242 and the gate electrode 224. In the present embodiment, the metal layer 820 includes nickel (Ni). Alternatively, the metal layer 820 may optionally include other metals such as cobalt, tungsten, tantalum, titanium, platinum, erbium, and palladium. The metal layer 820 may be formed by CVD, PVD, or other suitable techniques.

Figure 8C:
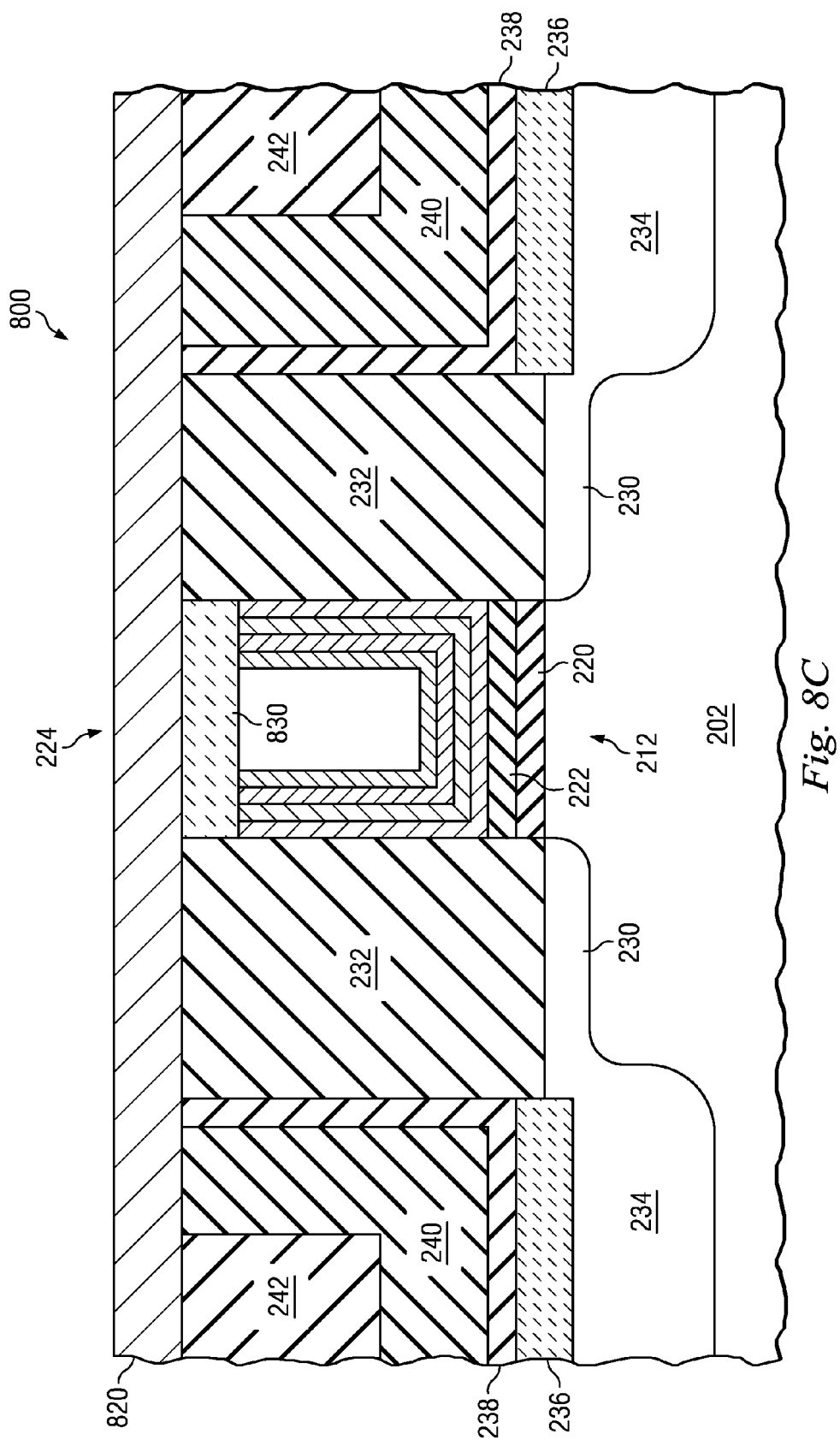

In FIG. 8C, a thermal process is performed to react the metal layer 820 with the Si atoms 810 within the gate electrode. The thermal process includes a temperature ranging from about 200° C. to about 500° C. The reaction forms a metal silicide at the top portion of the gate electrode. In the present embodiment, the Ni reacts with the Si atoms at the top portion of the gate electrode 224 to form a nickel silicide 830. It is noted this is a self-aligned silicidation (salicidation) process since the metal layer that is next to the silicon reacts to form the metal silicide whereas the metal layer next to the silicon oxide and silicon nitride does not react. Thus, no extra masks are needed to form the nickel silicide 830.

Figure 8D:
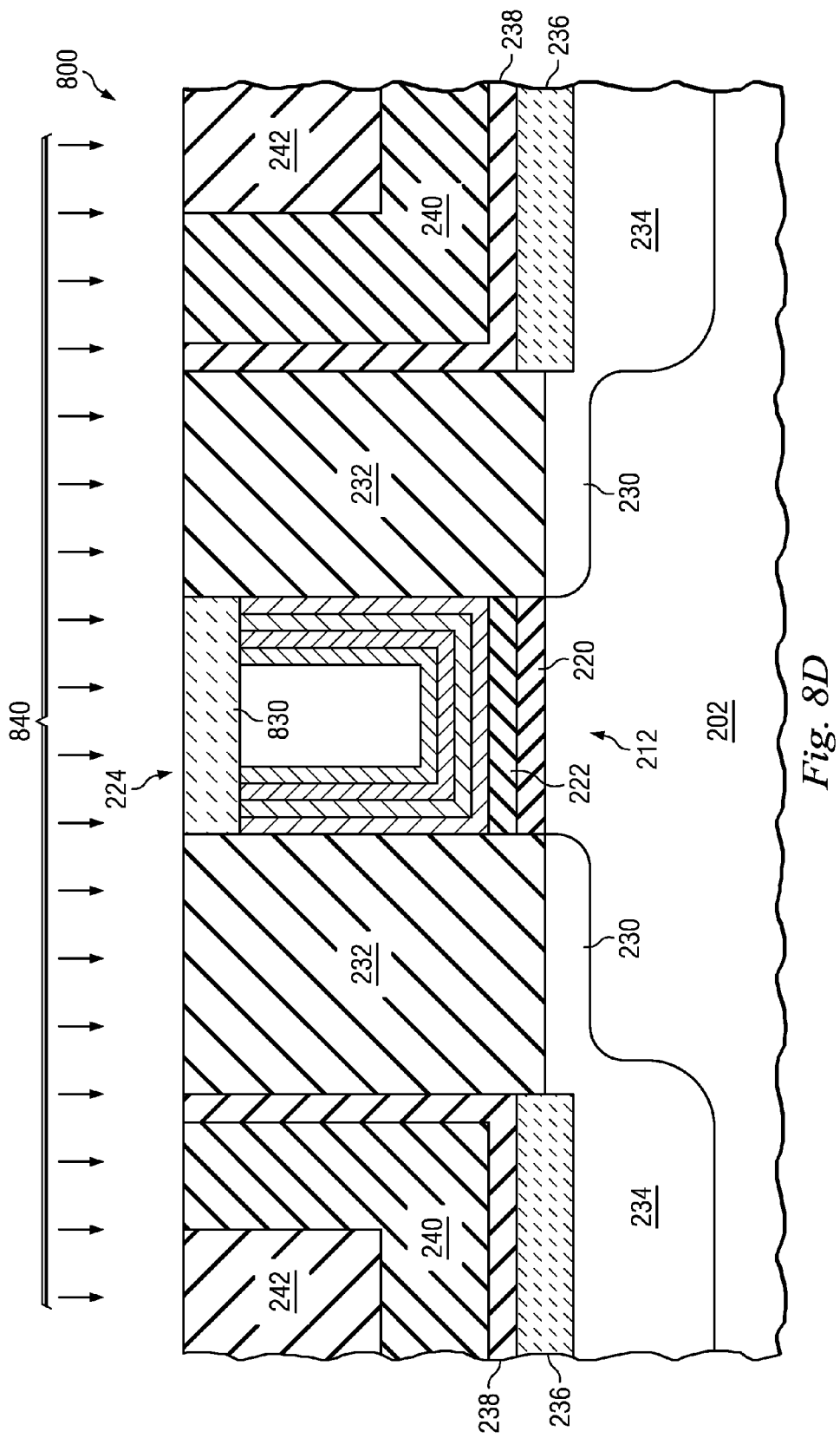

In FIG. 8D, the un-reacted portions of the metal layer 820 may be removed by an etching process or CMP process 840. Accordingly, the nickel 830 remains at the top portion of the gate electrode. It is understood that the semiconductor device 800 may undergo further CMOS process flow to form various features such as contacts/vias, interconnect metal layers, dielectric layers, passivation layers, etc. It has been observed that the nickel silicide 830 used as the gate contact material reduces the gate resistance of the nFET 212 and pFET 214. Additionally, it is noted that the nickel silicide 830 on the top portion of the gate electrode provides better selectivity during contact etch stop, and thus a larger process window for forming contacts to couple to the gate electrode is achieved. Moreover, the nickel silicide 830 can function as a stressor to stress the channel region of the nFET 212 and pFET 214 for better carrier mobility.

Figure 9A:
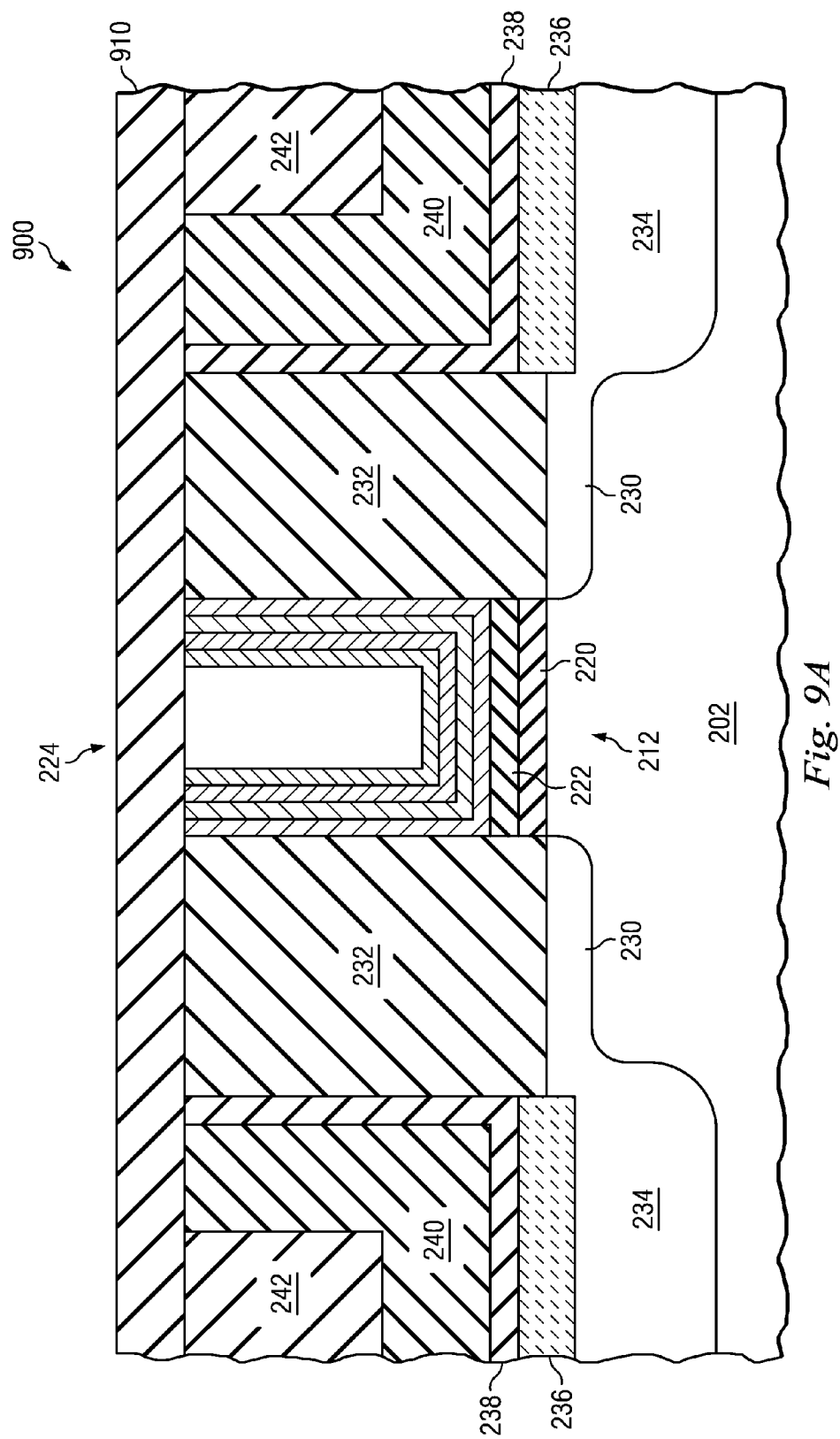
FIGS. 9A-9B are cross-sectional views of yet another embodiment of a semiconductor device at various stages of fabrication according to the method of FIG. 7.
Figure 9B:
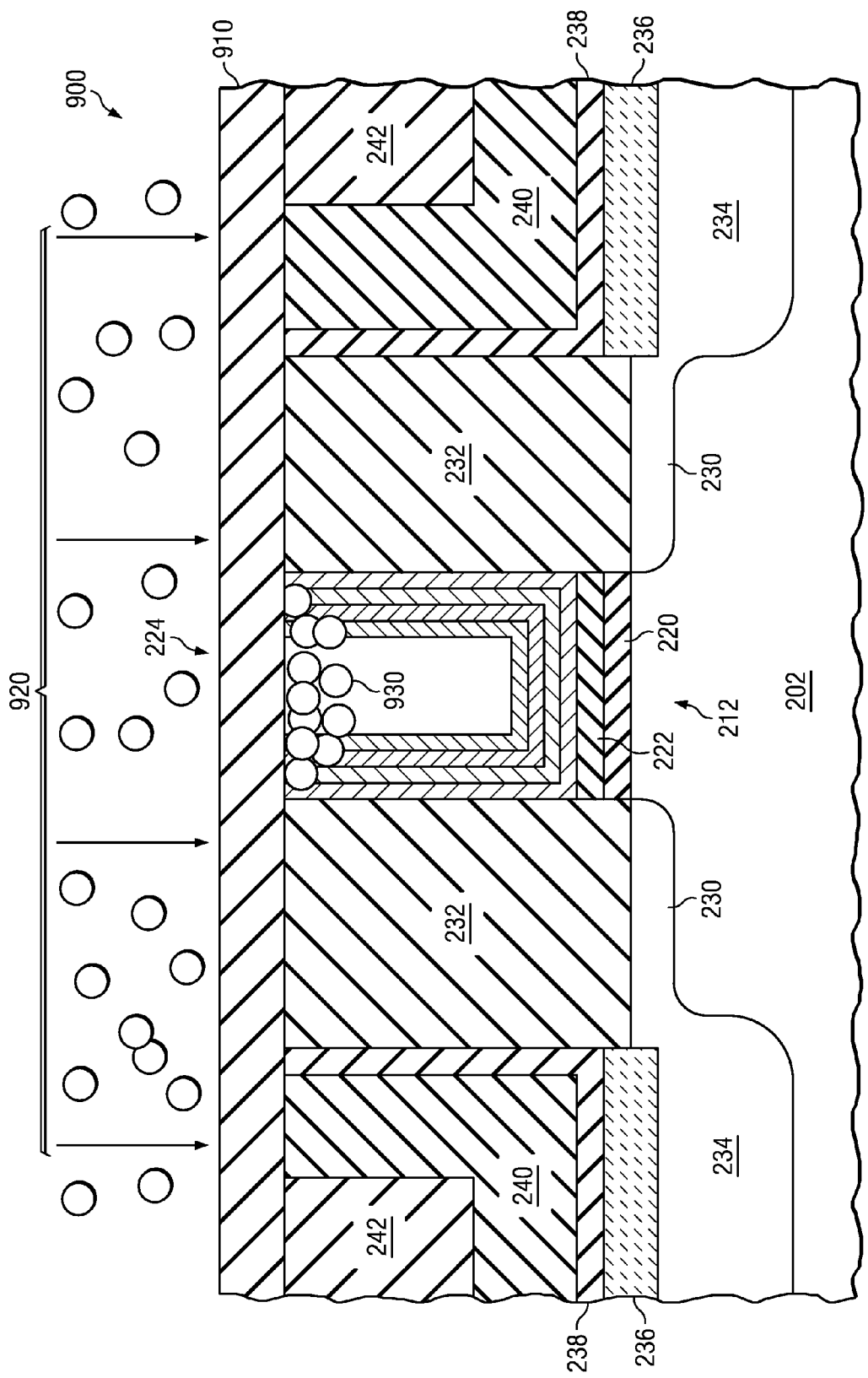

Referring now to FIGS. 9A and 9B, illustrated is another embodiment of a semiconductor device 900 being fabricated according to the method 700 of FIG. 7. The semiconductor device 900 is similar to the semiconductor device 800 of FIG. 8 except for the differences discussed below. In FIG. 9A, a sacrificial layer 910 is formed over the ILD 242 and the gate electrode 224. The sacrificial layer 910 includes silicon oxide. Alternatively, the sacrificial layer 910 may optionally include silicon nitride, titanium nitride, or other suitable materials. The sacrificial layer 910 includes a thickness ranging from about 10 to about 100 angstrom (A). The sacrificial layer 910 may be formed by CVD, PVD, ALD, or other suitable technique. The sacrificial layer 910 functions to control an implant depth of an implantation process that follows.

In FIG. 9B, an implantation process 920 is performed to implant Si ions or atoms 930 into a top portion of the gate electrode 224. The implantation process 920 utilizes a dosage ranging from about 5E15 atoms/cm$^2$ to about 5E17 atoms/cm$^2$. In other embodiments, the implantation process may also include Ge atoms. As noted above, the sacrificial layer 910 allows for better control of the implant depth of the Si atoms 930. Following the implantation process 920, the sacrificial layer 910 is removed by an etching process or other suitable technique. The semiconductor device 900 continues with processing as was discussed with reference to FIGS. 8B-8D. Accordingly, a metal silicide feature is formed at the top portion of the gate electrode, and the thickness of the metal silicide feature can be controlled by controlling the implant depth of the Si atoms.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the specified thickness of the hybrid metal structures formed at the top portion of the gate electrode may be adjusted to optimize the performance characteristics of the nFET and pFET devices for a particular technology node and application.

What is claimed is:

1. A method of fabricating a semiconductor device, comprising:
    providing a semiconductor substrate;
    forming a metal gate and a dielectric material layer adjacent the metal gate on the substrate, the metal gate having a first gate resistance and an upper surface that is substantially coplanar with an upper surface of the dielectric material layer;
    removing a portion of the metal gate thereby forming a trench that extends below the upper surface of the dielectric material layer; and
    forming a conductive structure within the trench such that a second gate resistance of the conductive structure and remaining portion of the metal gate is lower than the first gate resistance, wherein the forming the conductive structure within the trench includes:
        forming a material layer within the trench;
        forming a metal layer over the material layer; and
        performing a thermal process to react the material layer with the metal layer to form the conductive structure.

2. The method of claim 1, wherein the forming the material layer within the trench includes forming an amorphous layer filling the trench,
    wherein the performing the thermal process to react the material layer with the metal layer to form the conductive structure includes performing the thermal process to react the metal layer with the amorphous layer, and
    wherein the forming the conductive structure further includes:
        performing a CMP to remove portions of the amorphous layer disposed outside the trench; and
        removing unreacted portions of the metal layer disposed outside the trench.

3. The method of claim 2, wherein the amorphous layer includes one of a silicon layer, a silicon germanium layer, and a germanium layer, and wherein the metal layer includes a Ni layer.

4. The method of claim 1, wherein the forming the material layer within the trench includes forming a seed layer partially filling the trench and forming a semiconductor layer filling the remainder of the trench,
    wherein the performing the thermal process to react the material layer with the metal layer to form the conductive structure includes performing the thermal process to react the metal layer with the seed and semiconductor layers, and
    wherein the forming the conductive structure further includes:
        performing a CMP to remove portions of the seed layer and the semiconductor layer disposed outside the trench; and
        removing unreacted portions of the metal layer disposed outside the trench.

5. The method of claim 4, wherein the seed layer includes a Si layer, wherein the semiconductor layer includes a SiGe layer, and wherein the metal layer includes a Ni layer.

6. The method of claim 5, wherein the forming the SiGe layer includes adjusting a percentage of germanium to modulate a gate stress.

7. The method of claim 1, wherein the forming the metal gate includes forming the metal gate in a gate last process.

8. A method of fabricating a semiconductor device, comprising:
    providing a semiconductor substrate;
    forming a metal gate on the substrate in a gate last process, the metal gate having a first gate resistance;
    implanting Si ions into the metal gate on the substrate;
    forming a metal layer over the metal gate; and
    performing a thermal process to react the metal layer and the Si ions to form a metal silicide in such a manner that the remaining portion of the gate has a second gate resistance lower than the first resistance.

9. The method of claim 8, wherein the implanting Si ions into the metal gate includes implanting Si ions into a top portion of the metal gate, and
    wherein the forming the metal layer over the metal gate includes forming the metal layer over the top portion of the metal gate.

10. The method of claim 9, further comprising:
    forming a sacrificial layer over the metal gate prior to the implanting; and
    removing the sacrificial layer after the implanting.

11. The method of claim 9, wherein the metal layer includes a Ni layer.

12. A semiconductor device, comprising:
    a semiconductor substrate; and
    a gate structure disposed on the substrate, the gate structure including a gate dielectric and a gate electrode, wherein the gate electrode includes:
        a lower portion disposed on the gate dielectric and formed of a first metal structure, the first metal structure including a first metal portion having a substantially u-shaped profile defining a trench and a second metal portion disposed within the trench, the first and second metal portions having substantially coplanar upper surfaces; and
        an upper portion formed of a second metal structure different from the first metal structure and disposed directly on the upper surfaces of the first and second metal portions of the first metal structure;

wherein the gate electrode has a first gate resistance that is lower than a second gate resistance for another gate electrode that would have been formed of the first metal structure and not the second metal structure.

13. The semiconductor device of claim 12, wherein the second metal structure includes one of:
 a TaN layer and a Cu layer disposed on the TaN layer; and
 a nickel silicide layer.

14. The semiconductor device of claim 12, wherein the upper portion has a substantially planar surface that interfaces with the upper surfaces of the first and second metal portions of the first metal structure.

15. The semiconductor device of claim 12, wherein the first metal structure includes multi-layer metal structure that includes one of a p-type work function metal and an n-type work function metal.

16. The method of claim 1, wherein the forming the material layer within the trench includes forming an amorphous layer filling the trench, and
 wherein the performing the thermal process to react the material layer with the metal layer to form the conductive structure includes performing the thermal process to react the metal layer with the amorphous layer.

17. The method of claim 16, wherein the amorphous layer includes one of a silicon layer, a silicon germanium layer, and a germanium layer, and wherein the metal layer includes a Ni layer.

18. The method of claim 1, wherein the forming the material layer within the trench includes forming a seed layer partially filling the trench and forming a semiconductor layer filling the remainder of the trench, and
 wherein the performing the thermal process to react the material layer with the metal layer to form the conductive structure includes performing the thermal process to react the metal layer with the seed and semiconductor layers.

19. The method of claim 18, wherein the seed layer includes a Si layer, wherein the semiconductor layer includes a SiGe layer, and wherein the metal layer includes a Ni layer.

20. The method of claim 8, further comprising removing unreacted portions of the metal layer after performing the thermal process.

\* \* \* \* \*